US008835901B2

(12) United States Patent
Tachibana et al.

(10) Patent No.: US 8,835,901 B2
(45) Date of Patent: Sep. 16, 2014

(54) SEMICONDUCTOR LIGHT EMITTING DEVICE

(75) Inventors: Koichi Tachibana, Kanagawa-ken (JP);
Hajime Nago, Kanagawa-ken (JP);
Toshiki Hikosaka, Kanagawa-ken (JP);
Shigeya Kimura, Kanagawa-ken (JP);
Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 624 days.

(21) Appl. No.: 13/030,440

(22) Filed: Feb. 18, 2011

(65) Prior Publication Data

US 2012/0049155 A1 Mar. 1, 2012

(30) Foreign Application Priority Data

Aug. 26, 2010 (JP) ................................ 2010-189387
Jan. 18, 2011 (JP) ................................ 2011-008243

(51) Int. Cl.
*H01L 33/32* (2010.01)
*H01L 33/06* (2010.01)
*H01L 33/04* (2010.01)
*H01L 33/12* (2010.01)

(52) U.S. Cl.
CPC ............... *H01L 33/04* (2013.01); *H01L 33/12* (2013.01); *H01L 33/06* (2013.01); *H01L 33/32* (2013.01)
USPC .................... 257/13; 257/14; 257/15; 257/96; 257/94; 257/E33.034; 257/E33.033

(58) Field of Classification Search
USPC ............... 257/12, 13, 14, 15, 94, 96, 97, 103, 257/E33.033, E33.034
See application file for complete search history.

(56) References Cited

U.S. PATENT DOCUMENTS

| 2008/0023689 A1* | 1/2008 | Kim et al. ...................... 257/13 |
| 2011/0187294 A1* | 8/2011 | Bergmann et al. ............ 315/363 |

FOREIGN PATENT DOCUMENTS

| EP | 2 365 540 A2 | 9/2011 |
| JP | 2000-244070 | 9/2000 |
| JP | 2001-332761 | 11/2001 |
| JP | 2006-128607 | 5/2006 |
| JP | 2007-110090 | 4/2007 |
| JP | 2007-123878 | 5/2007 |

(Continued)

OTHER PUBLICATIONS

U.S. Appl. No. 13/206,700, filed Aug. 10, 2011, Hikosaka, et al.
Notification of Reason(s) for Refusal issued Mar. 7, 2012 in Japanese Patent Application No. 2011-008243 (with English translation).

(Continued)

*Primary Examiner* — Matthew W Such
*Assistant Examiner* — Scott Stowe
(74) *Attorney, Agent, or Firm* — Oblon, Spivak, McClelland, Maier & Neustadt, L.L.P.

(57) ABSTRACT

According to one embodiment, a semiconductor light emitting device includes a first semiconductor layer, a second semiconductor layer, a light emitting part, and a multilayered structural body. The light emitting part is provided between the first and second semiconductor layers and includes barrier layers and well layers alternately stacked. The multilayered structural body is provided between the first semiconductor layer and the light emitting part and includes high energy layers and low energy layers alternately stacked. An average In composition ratio on a side of the second semiconductor is higher than that on a side of the first semiconductor in the multilayered structural body. An average In composition ratio on a side of the second semiconductor is higher than that on a side of the first semiconductor in the light emitting part.

17 Claims, 7 Drawing Sheets

(56) References Cited

FOREIGN PATENT DOCUMENTS

| JP | 2007-227671 | 9/2007 |
|----|----|----|
| JP | 2008-34848 | 2/2008 |
| JP | 2011-187622 | 9/2011 |
| WO | WO 2007/138656 A1 | 12/2007 |
| WO | WO 2007/138658 A1 | 12/2007 |

OTHER PUBLICATIONS

U.S. Appl. No. 12/871,285, filed Aug. 30, 2010, Toshiki, Hikosaka et al.
U.S. Appl. No. 12/875,822, filed Sep. 3, 2010, Shigeya Kimura et al.
Office Action issued Oct. 28, 2011, in Japanese Patent Application No. 2011-008243 (with English-language translation).

* cited by examiner

SEMICONDUCTOR LIGHT EMITTING DEVICE

CROSS-REFERENCE TO RELATED APPLICATIONS

This application is based upon and claims the benefit of priority from the prior Japanese Patent Application No. 2010-189387, filed on Aug. 26, 2010 and the prior Japanese Patent Application No. 2011-008243, filed on Jan. 18, 2011; the entire contents of which are incorporated herein by reference.

FIELD

Embodiments described herein relate generally to a semiconductor light emitting device.

BACKGROUND

Group III-V nitride semiconductors such as gallium nitride (GaN) and so on have been applied to develop semiconductor light emitting devices such as high brightness ultraviolet-blue and green light emitting diodes (LED: Light Emitting Diode) and bluish-purple-blue and green laser diodes (LD: Laser Diode) and so on.

In order to achieve high efficiency of LEDs, it is important to increase the crystallinity of GaN based semiconductors, and increase the internal quantum efficiency of the crystals. There is a large difference in lattice constants of InGaN which is used for the active layers of ultraviolet-blue and green LEDs, and GaN used for the substrate layers, so strain can easily occur, and efficiency can easily decrease due to piezo-polarization.

For example, technology is known that attempts to reduce the shift in the light emission peak wavelength and increase the brightness control range by adjusting the well layer density on a first GaN based compound semiconductor side and the well layer density on a second GaN based compound semiconductor side of an active layer.

There is still room for further improvement of the internal quantum efficiency.

DETAILED DESCRIPTION

Figure 1:
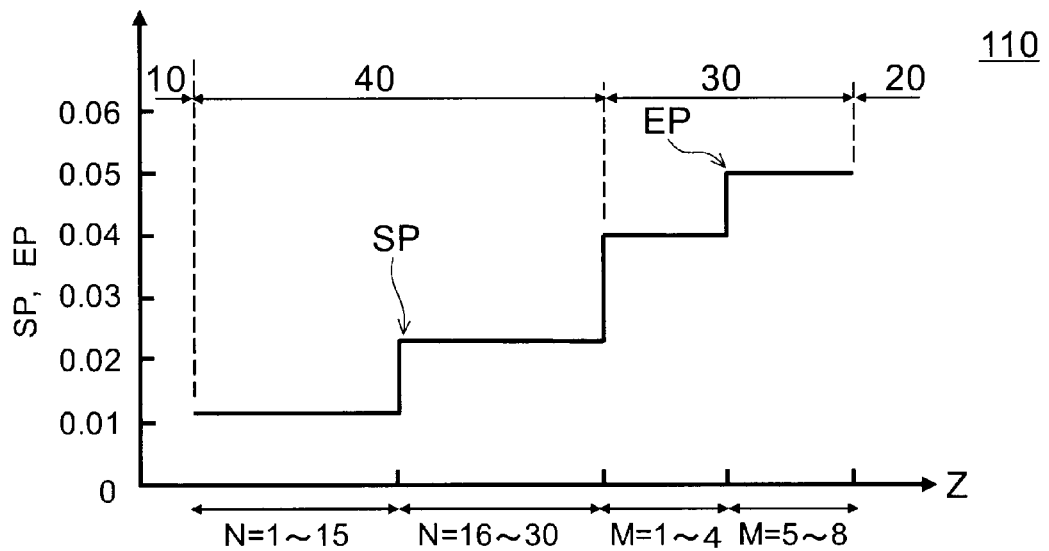
FIG. 1 is a schematic view illustrating the configuration of a semiconductor light emitting device according to an embodiment.

In general, according to one embodiment, a semiconductor light emitting device includes a first semiconductor layer, a second semiconductor layer, a light emitting part, and a multilayered structural body.

The first semiconductor layer has n-type conductivity and includes a nitride semiconductor. The second semiconductor layer has p-type conductivity and includes a nitride semiconductor.

The light emitting part is provided between the first semiconductor layer and the second semiconductor layer. The light emitting part includes a plurality of barrier layers and a plurality of well layers alternately stacked with the barrier layers. The barrier layers include a nitride semiconductor. The well layers include a nitride semiconductor and have a band gap energy lower than a band gap energy of the barrier layers.

The multilayered structural body is provided between the first semiconductor layer and the light emitting part. The multilayered structural body includes a plurality of high energy layers and a plurality of low energy layers alternately stacked with the high energy layers. The high energy layers include a nitride semiconductor. The low energy layers include a nitride semiconductor and have a band gap energy lower than a band gap energy of the high energy layers.

One of the high energy layers has an In composition ratio $x_a$ among group III elements and a layer thickness $t_a$ (nanometers). One of the low energy layers in contact with the one of the high energy layers has an In composition ratio $x_b$ among group III elements and a layer thickness $t_b$ (nanometers). Other one of the high energy layers located closer to the second semiconductor layer than the one of the high energy layers has an In composition ratio $x_c$ among group III elements and a layer thickness $t_c$ (nanometers). Other one of the low energy layers in contact with the other one of the high energy layers has an In composition ratio $x_d$ among group III elements and a layer thickness $t_d$ (nanometers). $SA2=(x_c \cdot t_c + x_d \cdot t_d)/(t_c+t_d)$ is higher than $SA1=(x_a \cdot t_a + x_b \cdot t_b)/(t_a+t_b)$.

One of the barrier layers has an In composition ratio $y_a$ among group III elements and a layer thickness $s_a$ (nanometers). One of the well layers in contact with the one of the barrier layers has an In composition ratio $y_b$ among group III elements and a layer thickness $s_b$ (nanometers). Other one of the barrier layers located closer to the second semiconductor layer than the one of the barrier layers has an In composition ratio $y_c$ among group III elements and a layer thickness $s_c$ (nanometers). Other one of the well layers in contact with the other one of the barrier layers has an In composition ratio $y_d$ among group III elements and a layer thickness $s_d$ (nanometers). $EA2=(y_c \cdot s_c + y_d \cdot s_d)/(s_c+s_d)$ is higher than $EA1=(y_a \cdot s_a + y_b \cdot s_b)/(s_a+s_b)$, and $EA1$ is higher than or equal to $SA2$.

Various embodiments will be described hereinafter with reference to the accompanying drawings.

Note that the drawings are schematic or simplified illustrations and that relationships between thicknesses and widths of parts and proportions in size between parts may differ from actual parts. Also, even where identical parts are depicted, mutual dimensions and proportions may be illustrated differently depending on the drawing.

Note that in the drawings and specification of this application, the same numerals are applied to elements similar to those described above with reference to the previous drawings, and the detailed descriptions thereof are omitted.

Embodiment

Figure 2:
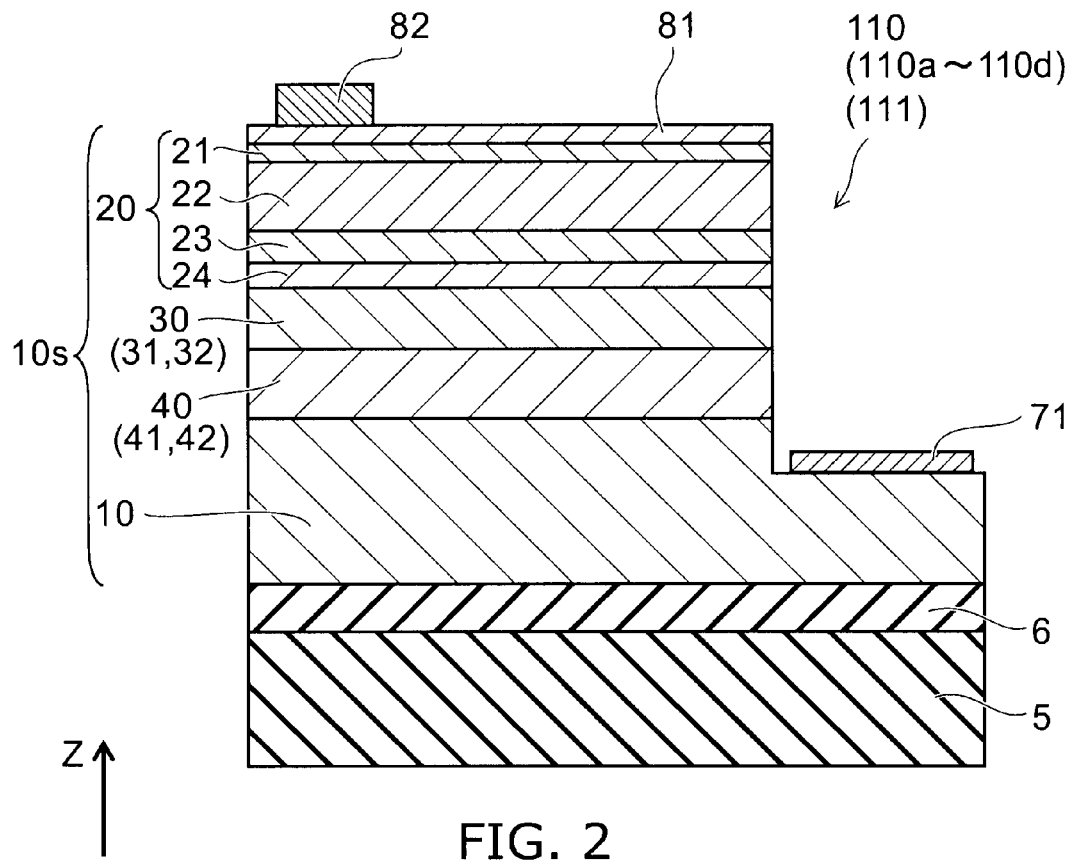
FIG. 2 is a schematic cross-sectional view illustrating the semiconductor light emitting device according to the embodiment.

FIG. 2 is a schematic cross-sectional view illustrating the configuration of the semiconductor light emitting device according to the embodiment.

First, an overview of the configuration of a semiconductor light emitting device 110 according to the embodiment will be described while referencing FIG. 2.

As illustrated in FIG. 2, the semiconductor light emitting device 110 according to the embodiment includes a first semiconductor layer 10, a second semiconductor layer 20, a light emitting part 30, and a multilayered structural body 40.

The first semiconductor layer 10 includes a nitride semiconductor. The first semiconductor layer 10 has n-type conductivity.

The second semiconductor layer 20 includes a nitride semiconductor. The second semiconductor layer 20 has p-type conductivity.

Here, a direction from the first semiconductor layer 10 toward the second semiconductor layer 20 is defined as a "Z-axis direction" (stacking direction).

The light emitting part 30 is provided between the first semiconductor layer 10 and the second semiconductor layer 20.

The multilayered structural body 40 is provided between the first semiconductor layer 10 and the light emitting part 30.

An n-type GaN layer is used, for example, for the first semiconductor layer 10. A thickness of the first semiconductor layer 10 is, for example, approximately 4 μm (micrometers). The first semiconductor layer 10 is doped with an n-type impurity of at least one of Si, Ge, and Sn. In the example, Si is used as the n-type impurity. The doping amount of Si in the first semiconductor layer 10 is, for example, approximately $2 \times 10^{18}$ cm$^{-3}$.

The second semiconductor layer 20 includes, for example, a first p-type layer 21, a second p-type layer 22 provided between the first p-type layer 21 and the light emitting part 30, a third p-type layer 23 provided between the second p-type layer 22 and the light emitting part 30, and a fourth p-type layer 24 provided between the third p-type layer 23 and the light emitting part 30.

A p-type GaN layer is used, for example, for the fourth p-type layer 24. A p-type GaAlN layer is used, for example, for the third p-type layer 23. The third p-type layer 23 functions, for example, as an electron overflow suppression layer. A p-type GaN layer is used, for example, for the second p-type layer 22. A p-type GaN layer is used, for example, for the first p-type layer 21. The first p-side layer 21 functions, for example, as a contact layer. The second semiconductor layer 20 is doped with a p-type impurity of at least one of Mg and Zn. In the example, Mg is used as the p-type impurity.

The thickness of the fourth p-type layer 24 (p-type GaN layer) is, for example 30 nanometers (nm). The doping amount of Mg in the fourth p-type layer 24 is, for example, approximately $4 \times 10^{18}$ cm$^{-3}$. An $In_{0.01}Ga_{0.99}N$ layer about 30 nm thick, for example, can be used as the fourth p-type layer 24.

A $Ga_{0.8}Al_{0.2}N$ layer, for example, is used for the third p-type layer 23. The thickness of the third p-type layer 23 is, for example, about 10 nm. The doping amount of Mg in the third p-type layer 23 is, for example, approximately $4 \times 10^{18}$ cm$^{-3}$.

The thickness of the second p-type layer 22 is, for example, about 50 nm. The doping amount of Mg in the second p-type layer 22 is, for example, approximately $1 \times 10^{19}$ cm$^{-3}$.

The thickness of the first p-type layer 21 is, for example, about 60 nm. The doping amount of Mg in the first p-type layer 21 is, for example, approximately $1 \times 10^{20}$ cm$^{-3}$.

Thus, a stacked structural body 10s included in the semiconductor light emitting device 110 includes the first semiconductor layer 10, the second semiconductor layer 20, the multilayered structural body 40, and the light emitting part 30.

The semiconductor light emitting device 110 may further include a substrate 5 provided on a side of the first semiconductor layer 10 opposite to the multilayered structural body 40, and a buffer layer 6 provided between the substrate 5 and the first semiconductor layer 10. Specifically, the stacked structural body 10s is formed on the buffer layer 6 formed on the substrate 5. Various materials can be used for the substrate 5 such as sapphire, GaN, SiC, Si, GaAs, and the like. In the following, sapphire is used for the substrate 5.

On a first major surface of the second semiconductor layer 20 side of the stacked structural body 10s, a part of the first semiconductor layer 10 and a part of the light emitting part 30, the multilayered structural body 40, and the second semiconductor layer 20 are removed, and the first semiconductor layer 10 is exposed on the first major surface side. A first electrode 71 is provided in contact with the exposed first semiconductor layer 10 and a second electrode 81 is provided in contact with the second semiconductor layer 20. Furthermore, a second electrode side pad part 82 may be provided in contact with the second electrode 81.

For example, indium tin oxide (ITO) is used for the second electrode 81. The thickness of the second electrode 81 is, for example, about 0.2 μm. Au, for example, is used for the second electrode side pad part 82. The thickness of the second electrode pad part 82 is, for example about 1.0 μm.

A composite film (Ti film/Pt film/Au film) that includes, for example, an Au layer, a Pt layer provided between the Au layer and the first semiconductor layer 10, and a Ti layer provided between the Pt layer and the first semiconductor layer 10 is used in the first electrode 71. The thickness of the Ti film is, for example, about 0.05 μm, the thickness of the Pt film is, for example, about 0.05 μm, and the thickness of the Au film is, for example, about 1.0 μm.

After forming the stacked structural body 10s mentioned above on the substrate 5, the substrate 5 and the buffer layer 6 may be removed. In other words, in the semiconductor light emitting device 110, the substrate 5 and the buffer layer 6 may be provided or omitted as necessary.

Figure 3:
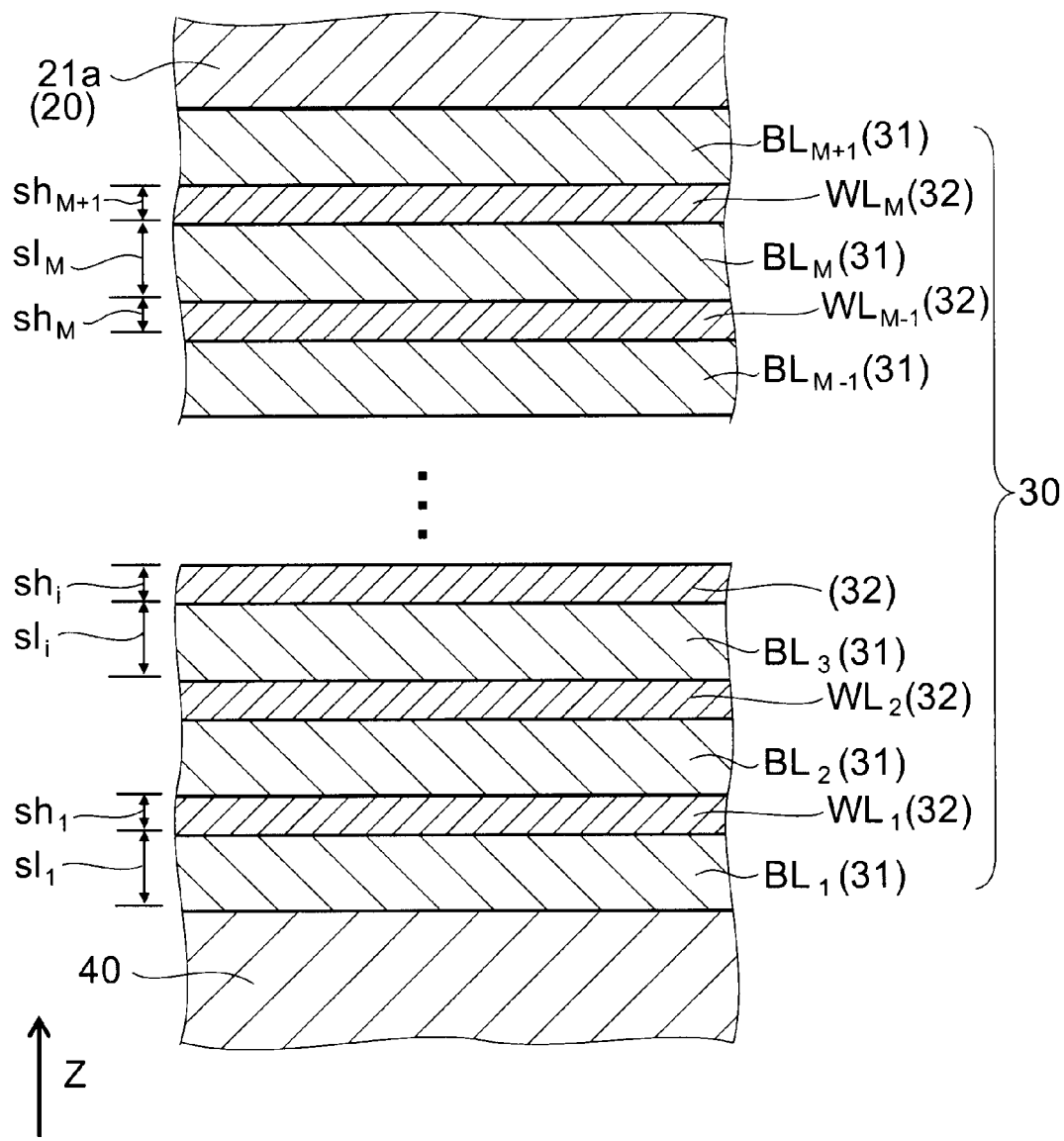
FIG. 3 is a schematic cross-sectional view illustrating the configuration of part of the semiconductor light emitting device according to the embodiment.

FIG. 3 is a schematic cross-sectional view illustrating the configuration of part of the semiconductor light emitting device according to the embodiment.

As illustrated in FIG. 3, the light emitting part 30 includes a plurality of barrier layers 31 and a plurality of well layers 32 alternately stacked with the plurality of barrier layers 31. The plurality of barrier layers 31 include a nitride semiconductor. The plurality of well layers 32 include a nitride semiconductor. Each of the plurality of well layers 32 has a band gap energy lower than a band gap energy of each of the plurality of barrier layers 31.

The plurality of barrier layers 31 and the plurality of well layers 32 are alternately stacked along the Z-axis direction. The light emitting part 30 has a multi quantum well (MQW) structure including three or more barrier layers 31 and a well layer 32 provided between pairs of the barrier layers 31.

The barrier layers 31 include a nitride semiconductor including a group III element and a group V element. The well layer 32 includes a nitride semiconductor including a group III element and a group V element. The well layer 32 includes a nitride semiconductor including indium (In) and gallium (Ga).

Here, it is assumed that a number of barrier layers 31 is (M+1) (where M is an integer greater than or equal to 2). A number of the well layers 32 is M.

The barrier layer 31, from among the plurality of barrier layers 31, closest to the first semiconductor layer 10 is referred to as a first barrier layer $BL_1$. Then, a second barrier layer $BL_2$ to a (M+1)th barrier layer $BL_{M+1}$ are arranged in this order along a positive direction of the Z-axis which is from the first semiconductor layer 10 toward the second semiconductor layer 20.

In other words, the (i+1)th barrier layer 31 (where "i" is an integer greater than or equal to 1 and less than or equal to M) is disposed closer to the second semiconductor layer 20 than the ith barrier layer 31.

The well layer 32, from among the plurality of well layers 32, closest to the first semiconductor layer 10 is referred to as a first well layer $WL_1$. Then a second well layer $WL_2$ to an Mth well layer $BL_M$ are arranged in this order along the positive direction of the Z-axis from the first semiconductor layer 10 toward the second semiconductor layer 20.

The ith well layer 32 is disposed between the ith barrier layer 31 and the (i+1)th barrier layer 31.

In this example, M is 8.

A GaN layer with a thickness of 5.0 nm is used for the first barrier layer $BL_1$ to the fourth barrier layer $BL_4$. An undoped $In_{0.12}Ga_{0.88}N$ layer with a thickness of 2.5 nm is used for the first well layer $WL_1$ to a fourth well layer $WL_4$.

A GaN layer with a thickness of 5.0 nm is used for the fifth barrier layer $BL_5$ to a ninth barrier layer $BL_9$. An undoped $In_{0.15}Ga_{0.85}N$ layer with a thickness of 2.5 nm is used for the fifth well layer $WL_5$ to the eighth well layer $WL_8$.

In this way, in the semiconductor light emitting device 110, the In composition ratio of the well layers 32 varies along the Z-axis direction in the light emitting part 30. The peak wavelength of the wavelengths of the emitted light in the $In_{0.15}Ga_{0.85}N$ layer (thickness 2.5 nm), which is a part of the well layer 32, is 450 nm as determined by photoluminescence. The peak wavelength of the wavelengths of the emitted light in the $In_{0.12}Ga_{0.88}N$ layer (thickness 2.5 nm), which is a part of the well layer 32, is 425 nm as determined by photoluminescence.

Figure 4:
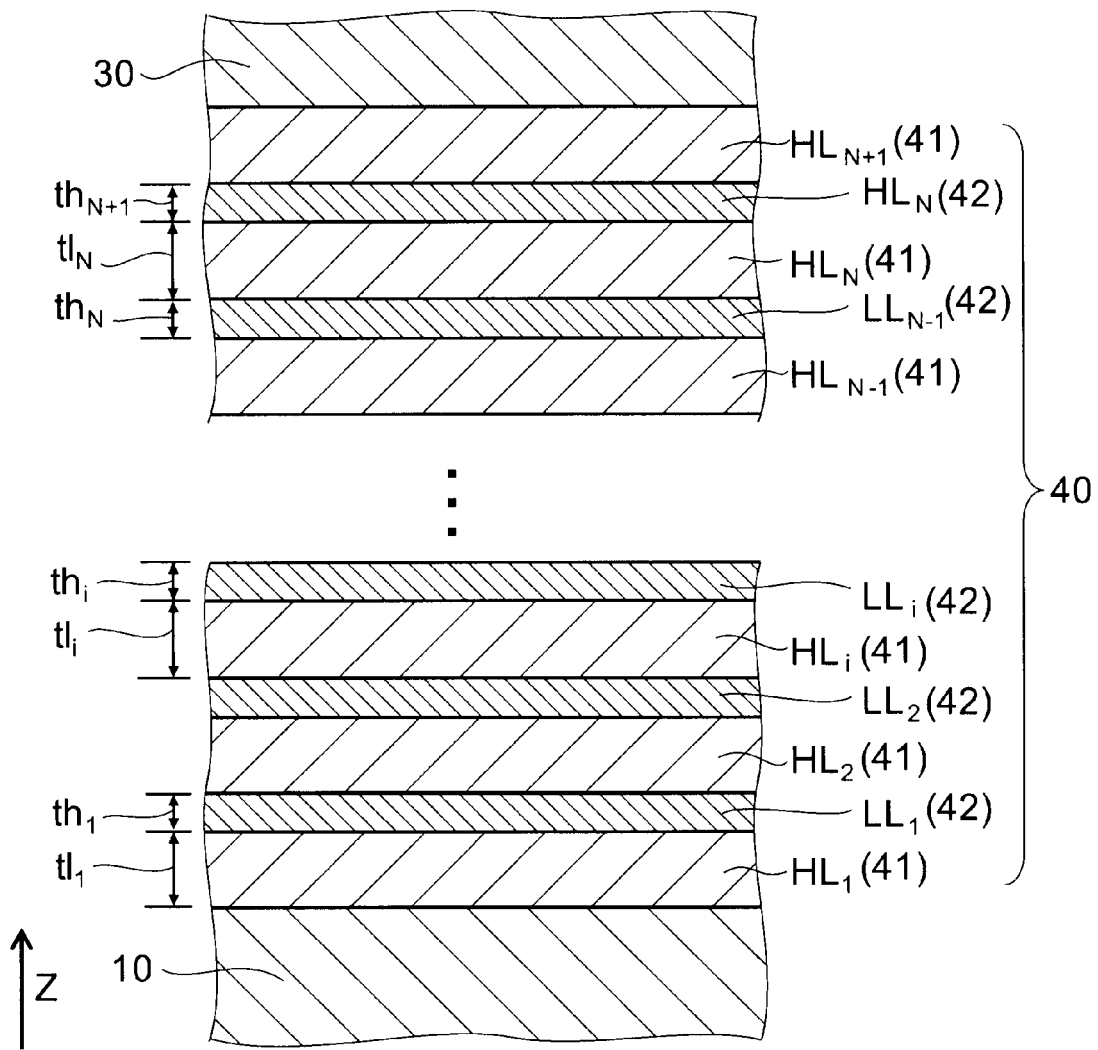
FIG. 4 is a schematic cross-sectional view illustrating the configuration of part of the semiconductor light emitting device according to the embodiment.

FIG. 4 is a schematic cross-sectional view illustrating the configuration of part of the semiconductor light emitting device according to the embodiment.

As illustrated in FIG. 4, the multilayered structural body 40 includes a plurality of high energy layers 41 and a plurality of low energy layers 42 alternately stacked with the plurality of high energy layers 41. The plurality of high energy layers 41 include a nitride semiconductor. The plurality of low energy layers 42 include a nitride semiconductor. Each of the plurality of low energy layers 42 has a band gap energy lower than a band gap energy of each of the plurality of high energy layers 41. Each of the plurality of low energy layers 42 has a band gap energy higher than a band gap energy of each of the plurality of well layers 32.

The multilayered structural body 40 is, for example, a superlattice layer.

The high energy layers 41 include, for example, a nitride semiconductor that includes a group III element and a group V element. The low energy layers 42 include a nitride semiconductor that includes a group III element and a group V element. The low energy layer 42 includes a nitride semiconductor that includes In and Ga.

It is assumed that a number of the plurality of high energy layers 41 is (N+1) (where N is an integer greater than or equal to 2). A number of the plurality of low energy layers 42 is N.

Among the plurality of high energy layers 41, the high energy layer 41 closest to the first semiconductor layer 10 is referred to as a first high energy layer $HL_1$. Then a second high energy layer $HL_2$ to an (N+1)th high energy layer $HL_{N+1}$ are arranged in this order along the positive direction of the Z-axis from the first semiconductor layer 10 toward the second semiconductor layer 20.

In other words, the (i+1)th high energy layer 41 (where "i" is an integer greater than 1 or equal to and less than or equal to N) is disposed closer to the second semiconductor layer 20 than the ith high energy layer 41.

Among the plurality of low energy layers 42, the low energy layer 42 closest to the first semiconductor layer 10 is referred to as a first low energy layer $LL_1$. Then a second low energy layer $LL_2$ to an Nth low energy layer $LL_N$ are arranged in this order along the positive direction of the Z-axis from the first semiconductor layer 10 toward the second semiconductor layer 20.

The ith low energy layer 42 is disposed between the ith high energy layer 41 and the (i+1)th high energy layer 41.

In the example, N is 30.

A GaN layer with a thickness of 3.0 nm is used for the first high energy layer $HL_1$ to the 15th high energy layer $HL_{15}$. An $In_{0.05}Ga_{0.95}N$ layer with a thickness of 1.0 nm is used for the first low energy layer $LL_1$ to the 15th low energy layer $LL_{15}$.

A GaN layer with a thickness of 3.0 nm is used for the 16th high energy layer $HL_{16}$ to the 31st high energy layer $HL_{31}$. An $In_{0.09}Ga_{0.91}N$ layer with a thickness of 1.0 nm is used for the 16th low energy layer $LL_{16}$ to the 30th low energy layer $LL_{30}$.

Thus, in the semiconductor light emitting device 110, the In composition ratio of the low energy layers 42 varies along the Z-axis direction in the multilayered structural body 40.

Here, in the multilayered structural body 40, an average In composition ratio is defined for pairs of the high energy layers 41 and their adjacent low energy layers 42. In other words, one of the plurality of high energy layers 41 is assumed to have an In composition ratio xu among group III elements and a layer thickness tu (nanometers). The low energy layer 42 in contact with the one of the high energy layers 41 on the first semiconductor layer 10 side or the second semiconductor layer 20 side high energy layer is assumed to have an In composition ratio xv among group III elements and a layer thickness tv (nanometers).

Then an average In composition ratio SP of a pair in the multilayered structural body 40 is referred to as (xu·tu+xv·tv)/(tu+tv).

In the example, the average In composition ratio SP of the pairs in the multilayered structural body 40 varies along the Z-axis direction. In other words, in the pairs for N equal to 1 through 15, the average In composition ratio SP (N=1 to 15) is 0.0125. In the pairs for N equal to 16 through 31, the average In composition ratio SP (N=16 to 31) is 0.0225.

Likewise, in the light emitting part 30, an average In composition ratio is defined for pairs of barrier layers 31 and their well layers 32.

One of the plurality of barrier layers 31 has an In composition ratio yu among group III elements and a layer thickness su (nanometers). The well layer 32 in contact with the one of the barrier layers 31 on the first semiconductor layer 10 side or the second semiconductor layer 20 side has an In composition ratio yv among group III elements and a layer thickness sv (nanometers).

Then, an average In composition ratio EP of a pair in the light emitting part 30 is referred to as (yu·su+yv·sv)/(su+sv).

In the example, the average In composition ratio EP in the light emitting part 30 varies along the Z-axis direction. In other words, for the pairs for M equal to 1 through 4, the average In composition ratio EP (M=1 to 4) is 0.04. For the pairs for M equal to 5 through 8, the average In composition ratio EP (M=5 to 8) is 0.05.

FIG. 1 is a schematic view illustrating the configuration of a semiconductor light emitting device according to an embodiment.

Specifically, FIG. 1 illustrates the average In composition ratio SP in the multilayered structural body 40 and the average In composition ratio EP in the light emitting part 30. The horizontal axis represents the position along the Z-axis direction, and the vertical axis represents the average In composition ratio SP and the average In composition ratio EP.

As illustrated in FIG. 1, in the semiconductor light emitting device 110, the average In composition ratio SP of the portion of the multilayered structural body 40 on the second semiconductor layer 20 side is set to be higher than the average In composition ratio SP of the portion on the first semiconductor layer 10 side of the multilayered structural body 40. Also, the average In composition ratio EP of the portion of the light emitting part 30 on the second semiconductor layer 20 side is set to be higher than the average In composition ratio EP of the portion on the first semiconductor layer 10 side. Also, the average In composition ratio EP of the portion on the first semiconductor layer 10 side of the light emitting part 30 is set to be higher than the average In composition ratio SP of the portion of the multilayered structural body 40 on the second semiconductor layer 20 side.

Thereby, it is possible to adjust the crystal strain while suppressing dislocations or defects transmitted from the substrate 5 to the light emitting part 30. In this way the internal quantum efficiency is improved. In this way, it is possible to provide a semiconductor light emitting device with high efficiency. Furthermore, local increases in the crystal strain are suppressed, so the reliability can be improved.

Hereinafter, an example of a manufacturing method of the semiconductor light emitting device 110 will be described. To grow the crystals of the stacked structural body 10s, metal organic chemical vapor deposition (MOCVD), for example, is used. Alternately, molecular beam epitaxy (MBE) may also be used.

After forming the buffer layer 6 on the sapphire substrate 5, a crystal of the first semiconductor layer 10 is grown.

The crystals of the multilayered structural body 40 are grown on the first semiconductor layer 10 at a temperature higher than or equal to 700° C. and lower than or equal to 800° C., for example.

The crystals of the light emitting part 30 are grown on the multilayered structural body 40 at a temperature higher than or equal to 700° C. and lower than or equal to 800° C., for example.

The crystal of the fourth p-type layer 24 (GaN) is grown on the light emitting part 30 at a temperature higher than or equal to 1000° C. and lower than or equal to 1100° C., for example. If $In_{0.01}Ga_{0.99}N$ is used as the fourth p-type layer 24, the growth temperature is higher than or equal to 700° C. and lower than or equal to 800° C., for example.

The crystal of $Ga_{0.8}Al_{0.2}N$ of the third p-type layer 23 is grown on the fourth p-type layer 24 at a temperature higher than or equal to 1000° C. and lower than or equal to 1100° C., for example. The crystal of GaN of the second p-type layer 22 is grown on the third p-type layer 23 at a temperature higher than or equal to 1000° C. and lower than or equal to 1100° C., for example. The crystal of GaN of the first p-type layer 21 is grown on the second p-type layer 22.

Thus, the stacked structural body 10s is formed.

An ITO film is formed on the first p-type layer 21 of the stacked structural body 10s, and the ITO film is processed into a predetermined shape to form the second electrode 81. Furthermore, an Au film is formed, and the Au film is processed into a predetermined shape to form the second electrode side pad part 82.

A part of the stacked structural body 10s is etched, a part of the first semiconductor layer 10 is exposed, and the first electrode 71 is formed on the exposed part of the first semiconductor layer 10.

Thereby, the semiconductor light emitting device as illustrated in FIGS. 1 to 4 is formed.

Figure 5:
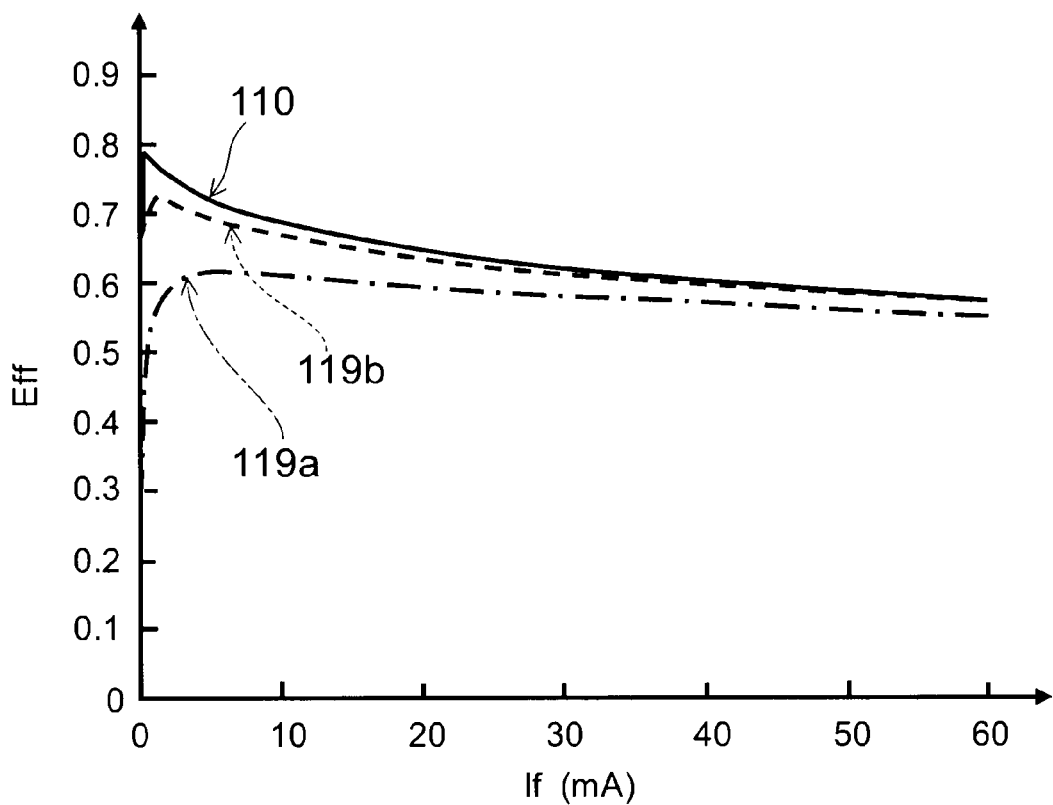
FIG. 5 is a graph illustrating the characteristics of semiconductor light emitting devices.

FIG. 5 is a graph illustrating the characteristics of semiconductor light emitting devices.

Besides illustrating the characteristics of the semiconductor light emitting device 110 according to the embodiment, this figure illustrates the characteristics of a semiconductor light emitting device 119a of a first reference example and a semiconductor light emitting device 119b of a second reference example.

In the semiconductor light emitting device 119a of the first reference example, the configurations of the barrier layers 31 and the well layers 32 included in the light emitting part 30 are fixed. Specifically, a GaN layer with a thickness of 5.0 nm is used for the first barrier layer $BL_1$ to the ninth barrier layer $BL_9$. An undoped $In_{0.15}Ga_{0.85}N$ layer with a thickness of 2.5 nm is used for the first well layer $WL_1$ to the eighth well layer $WL_8$. In other words, the average In composition ratio EP in the light emitting layer 30 is constant at 0.05.

In the semiconductor light emitting device 119a, the configurations of all the high energy layers 41 and the low energy layers 42 included in the multilayered structural body 40 are fixed. Specifically, a GaN layer with a thickness of 3.0 nm is used for the first high energy layer $HL_1$ to the 31st high energy layer $HL_{31}$. An $In_{0.09}Ga_{0.91}N$ layer with a thickness of 1.0 nm is used for the first low energy layer $LL_1$ through the 30th low energy layer $LL_{30}$. In other words, the average In composition ratio SP in the multilayered structural body 40 is constant at 0.0225.

The configuration of the light emitting part 30 of the semiconductor light emitting device 119b of the second reference example is the same as the configuration of the light emitting part 30 of the semiconductor light emitting device 110. Specifically, the average In composition ratio EP of a pair in the light emitting part 30 of the semiconductor light emitting device 119b is 0.04 in the portion on the first semiconductor layer 10 side, and 0.05 in the portion on the second semiconductor layer 20 side.

The configuration of the multilayered structural body 40 of the semiconductor light emitting device 119b is the same as that of the semiconductor light emitting device 119a according to the first reference example. In other words, the average In composition ratio SP in the multilayered structural body 40 is constant at 0.0225.

The horizontal axis of FIG. 5 represents a current If (milliampere: mA) flowing to the semiconductor light emitting device, and the vertical axis represents a luminous efficiency Eff.

As illustrated in FIG. 5, in the semiconductor light emitting device 119a of the first reference example, the luminous efficiency Eff is low. The maximum value of the luminous efficiency Eff in the semiconductor light emitting device 119a is 0.61.

As illustrated in FIG. 5, in the semiconductor light emitting device 119b of the second reference example, the luminous efficiency Eff is higher than that in the semiconductor light emitting device 119a. The maximum value of the luminous efficiency Eff in the semiconductor light emitting device 119b is 0.72, which is higher than that in the semiconductor light emitting device 119a.

As illustrated in FIG. 5, in the semiconductor light emitting device 110 according to the embodiment, the luminous efficiency Eff is higher than that in the semiconductor light emitting device 119b. The maximum value of the luminous efficiency Eff in the semiconductor light emitting device 110 is 0.78. Thus, in the embodiment, a higher luminous efficiency Eff is obtained compared with the second reference example.

It is considered that in the semiconductor light emitting device 119b of the second reference example, the reason the luminous efficiency Eff is improved compared with that in the semiconductor light emitting device 119a of the first reference example is to be because by varying the average In composition ratio of the light emitting part 30, defects and dislocations of the crystals in the light emitting part 30 are suppressed.

Moreover, it is considered that in the semiconductor light emitting device 110 according to the embodiment, the reason the luminous efficiency Eff is further improved compared with that in the semiconductor light emitting device 119b of the second reference example is to be because dislocations and defects transmitted to the light emitting part 30 from the substrate 5 are suppressed and the crystal strain is appropriately adjusted by varying the average In composition ratio SP in the multilayered structural body 40. Thereby, the internal quantum efficiency can be improved. According to the embodiment, a highly efficient semiconductor light emitting device can be obtained. Furthermore, the strain in the light emitting part 30 is suppressed, so the reliability is improved.

In superlattice layers of semiconductor light emitting devices, varying the thickness of alternating layers is known, but varying the average In composition ratio SP along the Z-axis direction in the multilayered structural body 40 (for example, higher on the second semiconductor layer 20 side than the portion on the first semiconductor layer 10 side) is not known. Additionally, in active layers of the semiconductor light emitting devices, varying the density of well layers is known, but varying the average In composition ratio EP along the Z-axis direction in the light emitting part 30, and varying the average In composition ratio SP along the Z-axis direction in the multilayered structural body 40 are not known.

In the semiconductor light emitting device 110 according to the embodiment, dislocations and defects transmitted to the light emitting part 30 from the substrate 5 are suppressed and the crystal strain is appropriately adjusted by making the average In composition ratio SP in the portion on the second semiconductor layer 20 side of the multilayered structural body 40 higher than the average In composition ratio SP in the portion on the first semiconductor layer 10 side. Thereby, the efficiency is improved, and furthermore the reliability is improved.

The thicknesses of the high energy layers 41, the low energy layers 42, the barrier layers 31, and the well layers 32 can be measured by, for example, transmission electron microscopy or the like. Additionally, the compositions of these layers can be measured by analysis using a method such as, for example, SIMS (secondary-ion mass spectrometry) or the like. Based on these measurement results, it is possible to determine the average In composition ratio.

Figure 6:
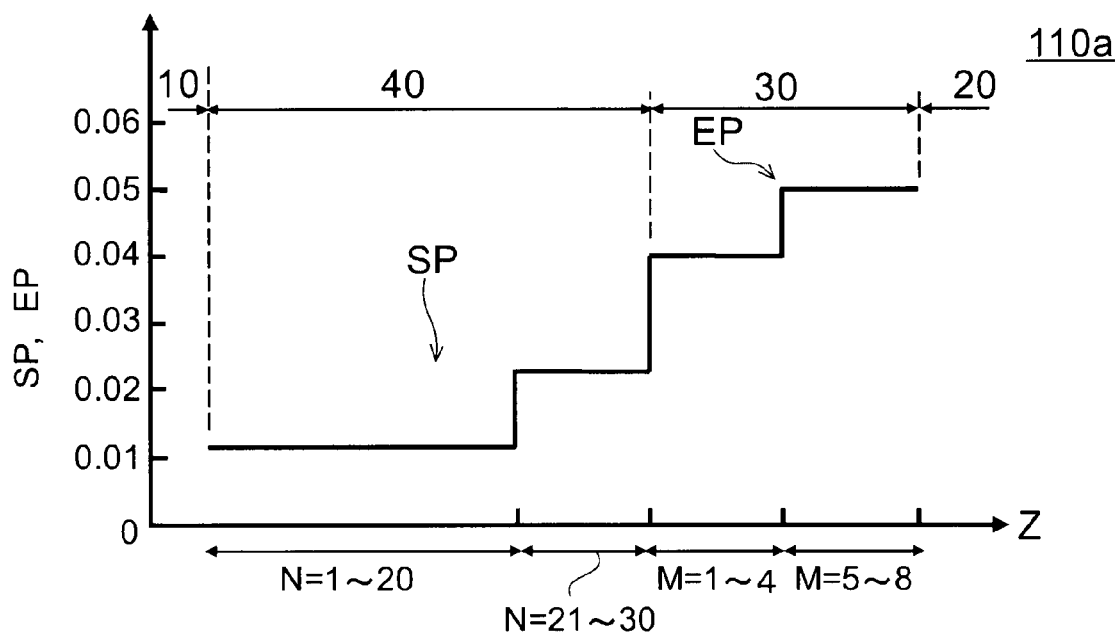
FIG. 6 is a schematic view illustrating the configuration of another semiconductor light emitting device according to the embodiment.

FIG. 6 is a schematic view illustrating the configuration of another semiconductor light emitting device according to the embodiment.

As illustrated in FIG. 6, the configuration of the light emitting part 30 of a semiconductor light emitting device 110a is the same as that of the semiconductor light emitting device 110. In other words, in the light emitting part 30 the average In composition ratio EP is 0.04 in the portion on the first semiconductor layer 10 side, and 0.05 in the portion on the second semiconductor layer 20 side.

Also, in the semiconductor light emitting device 110a, the configuration of the multilayered structural body 40 is varied for N=1 through 20 and N=21 through 30. Specifically, a GaN layer with a thickness of 3.0 nm is used for the first high band gap layer $HL_1$ to the 20th high energy layer $HL_{20}$, and an $In_{0.05}Ga_{0.95}N$ layer with a thickness of 1.0 nm is used for the first low energy layer $LL_1$ to the 20th low energy layer $LL_{20}$. Also, a GaN layer with a thickness of 3.0 nm is used for the 21st high band gap layer $HL_{21}$ to the 31st high energy layer $HL_{31}$, and an $In_{0.09}Ga_{0.91}N$ layer with a thickness of 1.0 nm is used for the 21st low energy layer $LL_{21}$ to the 30th low energy layer $LL_{30}$.

In the semiconductor light emitting device 110a with this configuration, the maximum value of the luminous efficiency Eff is 0.78, so the same high performance as the semiconductor light emitting device 110 is obtained. In other words, in the semiconductor light emitting device 110a also, a luminous efficiency Eff higher than that of the first reference example and the second reference example can be obtained. In this way various changes can be made to the average In composition ratio property of the multilayered structural body 40.

Also, the average In composition ratio SP of the portion of the multilayered structural body 40 on the second semiconductor layer 20 side is set to be higher than the average In composition ratio SP of the portion on the first semiconductor layer 10 side of the multilayered structural body 40.

In other words, one of the plurality of high energy layers 41 is assumed to have an In composition ratio xa among group III elements and a layer thickness to (nanometers). The low energy layer 42 in contact with the one of the plurality of high energy layers on the first semiconductor layer 10 side or the second semiconductor layer 20 side is assumed to have an In composition proportion xb among group III elements and a layer thickness tb (nanometers).

Also, other one of the high energy layers 41 located father to the second semiconductor layer 20 than the one of the plurality of high energy layers 41 is assumed to have an In composition ratio xc among group III elements and a layer thickness tc (nanometers). The low energy layer 42 in contact with the other one of the plurality of high energy layers 41 on the first semiconductor layer 10 side or the second semiconductor layer 20 side is assumed to have an In composition ratio xd among group III elements and a layer thickness td (nanometers).

Then, in the multilayered structural body 40, the average In composition ratio SA2 of one pair on the second semiconductor layer 20 side is $(xc \cdot tc + xd \cdot td)/(tc + td)$. On the other hand, the average In composition ratio SA1 of one pair on the first semiconductor layer 10 side is $(xa \cdot ta + xb \cdot tb)/(ta + tb)$. In the embodiment, SA2 is set to be higher than SA1.

Thereby, the occurrence of dislocations and defects in the light emitting part 30 is suppressed, and the luminous efficiency increases.

FIGS. 7A to 7H are schematic views illustrating configurations of other semiconductor light emitting devices according to the embodiment.

Specifically, these figures illustrate the property of the average In composition ratio SP of the multilayered structural body 40.

Figure 7A:
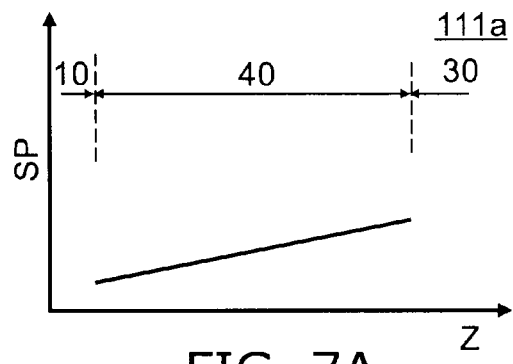
FIGS. 7A to 7 are schematic views illustrating other semiconductor light emitting devices according to the embodiment.

As illustrated in FIG. 7A, in a semiconductor light emitting device 111a according to this embodiment, the average In composition ratio SP in the multilayered structural body 40 increases continuously in the direction from the first semiconductor layer 10 toward the second semiconductor layer 20 (the positive Z-axis direction). In the example, the slope of the increase in the average In composition ratio SP is constant, but the slope may vary.

Figure 7B:
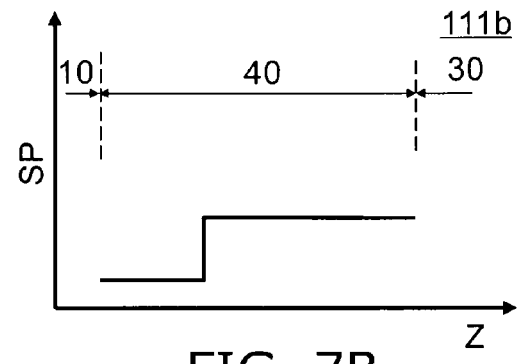

As illustrated in FIG. 7B, in a semiconductor light emitting device 111b according to the embodiment, the average In composition ratio SP in the multilayered structural body 40 has two values. The average In composition ratio SP in the portion on the second semiconductor layer 20 side is higher than the average In composition ratio SP in the portion on the first semiconductor layer 10 side. In this way, the average In composition ratio SP varies with a single step. As explained in the case of FIGS. 1 and 6, the position along the Z-axis direction where the average In composition ratio SP varies is as desired.

Figure 7C:
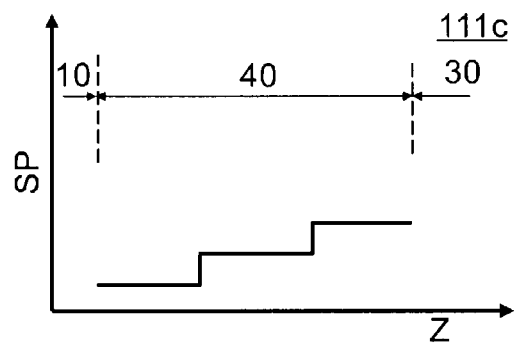

As illustrated in FIG. 7C, in a semiconductor light emitting device 111c according to the embodiment, the average In composition ratio SP in the multilayered structural body 40 varies with two steps.

Figure 7D:
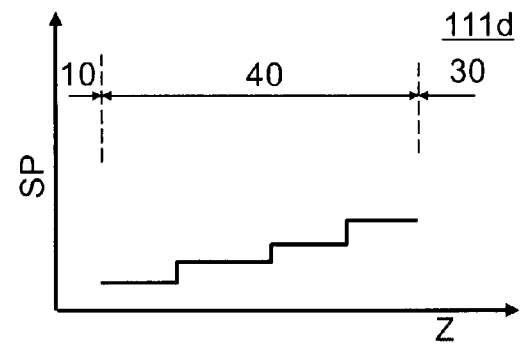

As illustrated in FIG. 7D, in a semiconductor light emitting device 111d according to the embodiment, the average In composition ratio SP in the multilayered structural body 40 varies with three steps.

Figure 7E:
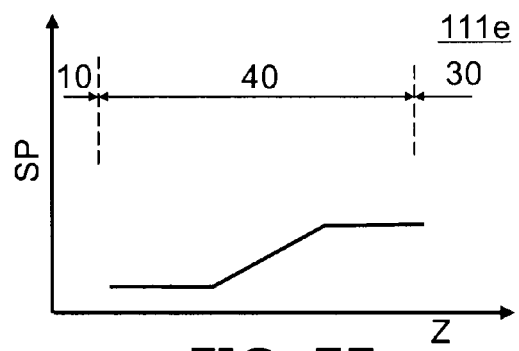

As illustrated in FIG. 7E, in a multilayered structural body 40a of a semiconductor light emitting device 111e according to the embodiment, the average In composition ratio SP has a low constant value region and a high constant value region, and a region between these two regions where the average In composition ratio SP varies continuously.

Thus, the average In composition ratio SP in the multilayered structural body 40 may vary continuously, or may vary in a stepwise manner in one or more steps.

In this way, the average In composition ratio SP in the multilayered structural body 40 increases in the direction from the first semiconductor layer 10 toward the second semiconductor layer 20. For example, the average In composition ratio SP gradually increases in the direction from the first semiconductor layer 10 toward the second semiconductor layer 20. Specifically, the average In composition ratio SP can increase in the direction from the first semiconductor layer 10 toward the second semiconductor layer 20 continuously or discontinuously (in stepwise). A number of steps in the variation of the average In composition ratio SP is as desired.

Thereby the occurrence of dislocations and defects in the light emitting part 30 is suppressed, and the luminous efficiency can be improved.

The embodiment is not limited thereto. For example, while the average In composition ratio SP is increasing continuously or discontinuously (in stepwise) in the direction from the first semiconductor layer 10 toward the second semiconductor layer 20, there may be a narrow region where the average In composition ratio SP decreases.

Figure 7F:
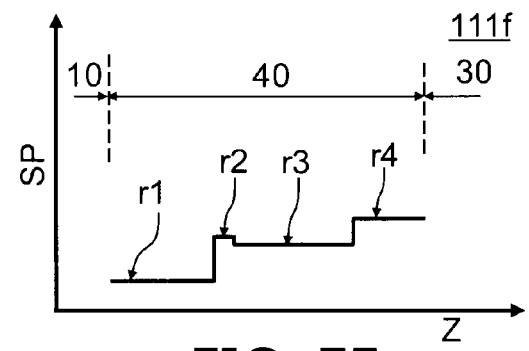

As illustrated in FIG. 7F, in a semiconductor light emitting device 111f according to the embodiment, while proceeding from the first semiconductor layer 10 to the second semiconductor layer 20, there is a region r1 where the average In composition ratio SP is low, then there is a region r2 where the average In composition ratio SP is higher than that of region r1, then there is a region r3 where the average In composition ratio SP is lower than that of region r2 and higher than that of region r1, and then there is a region r4 where the average In composition ratio SP is higher than that of region r2. The width of the region r2 (the length along the Z-axis direction) is small compared with that of region r1 or region r3. In this case also, the occurrence of dislocations and defects in the light emitting part 30 is suppressed, and the luminous efficiency can be improved. In other words, in the multilayered structural body 40, an approximate value of the average In composition ratio SP is set to be higher in the portion on the second semiconductor layer 20 side than the portion on the first semiconductor layer 10 side.

Figure 7G:
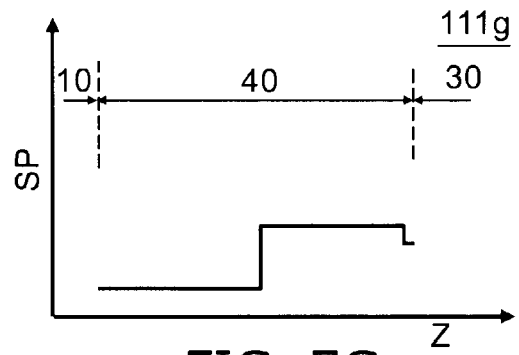

As illustrated in FIG. 7G, in a semiconductor light emitting device 111g according to the embodiment, while proceeding from the first semiconductor layer 10 to the second semiconductor layer 20, after the average In composition ratio SP has increased, the average In composition ratio SP decreases in a portion near the second semiconductor layer 20. In this case also, the approximate value of the average In composition ratio SP is set to be higher in the portion on the second semiconductor layer 20 side than in the first semiconductor layer 10 side.

Figure 7H:
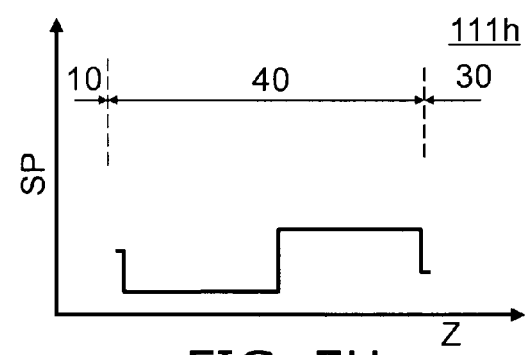

As illustrated in FIG. 7H, in a semiconductor light emitting device 111h according to the embodiment, the average In composition ratio SP in a portion near the first semiconductor layer 10 is comparatively high, and while proceeding from the first semiconductor layer 10 to the second semiconductor layer 20, there is a broad region where the average In composition ratio SP is low. Then, while proceeding further from the first semiconductor layer 10 to the second semiconductor layer 20, the average In composition ratio SP increases, and then near the second semiconductor layer 20 the average In composition ratio SP decreases. In this case also, the approximate value of the average In composition ratio SP is set to be higher in the portion on the second semiconductor layer 20 side than in the portion on the first semiconductor layer 10 side.

In the semiconductor light emitting devices 111g and 111h also, the occurrence of dislocations and defects in the light emitting part 30 is suppressed, and the luminous efficiency can be improved.

In the semiconductor light emitting device according to the embodiment, for example the average In composition ratio SP in the portion that is substantially half of the multilayered structural body 40 on the second semiconductor layer 20 side is higher than the average In composition ratio SP in the portion that is substantially half of the multilayered structural body 40 on the first semiconductor layer 10 side.

Here, in the above, examples have been explained where a high energy layer 41 is disposed between the low energy layer 42 (the first low energy layer $LL_1$) closest to the first semiconductor layer 10 and the first semiconductor layer 10. However, a high energy layer 41 need not be provided between the first low energy layer $LL_1$ and the first semiconductor layer 10. Also, an example has been explained where a high energy layer 41 is disposed between an Nth low energy layer $LL_N$) and the second semiconductor layer 20. However, a high energy layer 41 need not be provided between the Nth low energy layer $LL_N$ and the second semiconductor layer 20.

In this case also, an (i+1)th low energy layer 42 (where "i" is an integer greater than or equal to 1) (the (i+1)th low energy layer $LL_{i+1}$) is disposed closer to the second semiconductor layer 20 than the ith low energy layer 42 (ith low energy layer $LL_i$). Also, the (i+1)th high energy layer 41 (where i is an integer greater than or equal to 1) (the (i+1)th high energy layer $HL_{i+1}$) is disposed closer to the second semiconductor layer 20 than the ith high energy layer 41 (ith high energy layer $HL_i$). For example, if a high energy layer 41 is not provided between the first low energy layer $LL_1$ and the first semiconductor layer 10, the first high energy layer HL$_1$ is provided between the first low energy layer LL$_1$ and the second low energy layer LL$_2$.

The ith high energy layer 41 (the ith high energy layer HL$_i$) is assumed to have an In composition ratio xh$_i$ among group III elements, and a layer thickness th$_i$ (nanometers).

The ith low energy layer 42 (the ith low energy layer LL$_i$ is assumed to have an In composition ratio xl$_i$ among group III elements, and a layer thickness tl$_i$ (nanometers).

A number of the low energy layers 42 is N (where N is an integer greater than or equal to 2). The largest integer less than or equal to half of N is NLH.

A number of the high energy layers 41 located closer to the first semiconductor layer 10 than the NLHth low energy layer 42 (NLHth low energy layer LL$_{NLH}$) is NHH. NHH is, for example, the same as NLH, or it is (NLH−1).

A number of the high energy layers 41 located closer to the second semiconductor layer 20 than the (NLH−1)th low energy layer 42 (the (NLH−1)th low energy layer LL$_{NLH-1}$) is assumed to be NHR. (NHH+NHR) is (N−1) or N or (N+1).

Here, an average In composition ratio SH1 is expressed:

$$SH1 = \frac{\sum_{i=1}^{NHH}(xh_i \cdot th_i) + \sum_{i=1}^{NLH}(xl_i \cdot tl_i)}{\sum_{i=1}^{NHH}th_i + \sum_{i=1}^{NLH}tl_i} \quad (1)$$

The average In composition ratio SH1 corresponds to the average In composition ratio SP in the portion that is substantially half of the multilayered structural body 40 on the first semiconductor layer 10 side.

An average In composition ratio SH2 is expressed:

$$SH2 = \frac{\sum_{i=NHH+1}^{NHH+NHR}(xh_i \cdot th_i) + \sum_{i=NLH+1}^{N}(xl_i \cdot tl_i)}{\sum_{i=NHH+1}^{NHH+NHR}th_i + \sum_{i=NLH+1}^{N}tl_i} \quad (2)$$

The average In composition ratio SH2 corresponds to the average In composition ratio SP in the portion that is substantially half of the multilayered structural body 40 on the second semiconductor layer 20 side.

At this time, in the embodiment, the average In composition ratio SH2 is set to be higher than the average In composition ratio SH1.

In this way, the occurrence of dislocations and defects in the light emitting part 30 can be suppressed and the luminous efficiency can be improved, by setting the approximate value of the average In composition ratio SP in the multilayered structural body 40 to a higher value on the second semiconductor layer 20 side than on the first semiconductor layer 10 side.

Furthermore, in the semiconductor light emitting device according to the embodiment, in addition to the average In composition ratio SP varying along the Z-axis direction in the multilayered structural body 40 as described above, the average In composition ratio EP in the light emitting part 30 varies along the Z-axis direction.

Specifically, the average In composition ratio EP in a portion of the light emitting part 30 on the second semiconductor layer 20 side is set to be higher than the average In composition ratio EP in a portion on the first semiconductor layer 10 side of the light emitting part 30.

In other words, one of the plurality of barrier layers 31 is assumed to have an In composition ratio ya among group III elements and a layer thickness sa (nanometers). The well layer 32 in contact with the one of the plurality of barrier layers 31 on the first semiconductor layer 10 side or on the second semiconductor layer 20 side is assumed to have an In composition ratio yb among group III elements and a layer thickness sb (nanometers).

Other one of the barrier layers 31 located closer to the second semiconductor layer 20 than the one of the plurality of barrier layer 31 is assumed to have an In composition ratio yc among group III elements and a layer thickness sc (nanometers). The well layer 32 in contact with the other one of the plurality of barrier layers 31 on the first semiconductor layer 10 side or on the second semiconductor layer 20 side is assumed to have an In composition ratio yd among group III elements and a layer thickness sd (nanometers).

Here, the average In composition ratio EA2 of one pair located on the second semiconductor layer 20 side in the light emitting part 30 is expressed as (yc·sc+yd·sd)/(sc+sd). On the other hand, the average In composition ratio EA1 of the pair located on the first semiconductor layer 10 side is expressed as (ya·sa+yb·sb)/(sa+sb). In the embodiment, the EA2 is set to be higher than the EA1.

Thereby, the occurrence of dislocations and defects in the light emitting part 30 is suppressed, and the luminous efficiency increases.

FIGS. 8A to 8H are schematic views illustrating configurations of other semiconductor light emitting devices according to the embodiment.

Specifically, these figures illustrate the property of the average In composition ratio EP in the light emitting body 30.

Figure 8A:
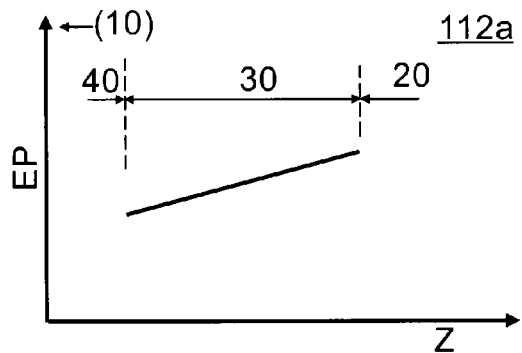
FIGS. 8A to 8H are schematic views illustrating other semiconductor light emitting devices according to the embodiment.

As illustrated in FIG. 8A, in a semiconductor light emitting device 112a according to the embodiment, the average In composition ratio EP in the light emitting part 30 increases continuously in the direction from the first semiconductor layer 10 toward the second semiconductor layer 20 (the positive Z-axis direction). In this example, the slope of the increase in the average In composition ratio EP is constant, but the slope may vary.

Figure 8B:
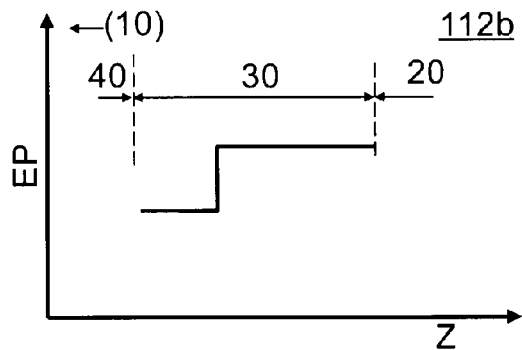

As illustrated in FIG. 8B, in a semiconductor light emitting device 112b according to the embodiment, the average In composition ratio EP in the light emitting part 30 has two values. The average In composition ratio EP in the portion on the second semiconductor layer 20 side is set to be higher than the average In composition ratio EP in the portion on the first semiconductor layer 10 side. In this way, the average In composition ratio EP varies with a single step. The position along the Z-axis direction where the average In composition ratio EP varies is as desired.

Figure 8C:
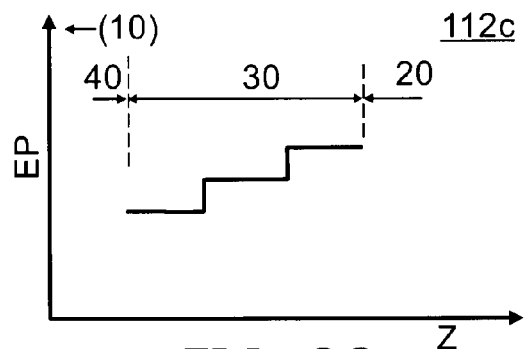

As illustrated in FIG. 8C, in a semiconductor light emitting device 112c according to the embodiment, the average In composition ratio EP in the light emitting part 30 varies with two steps.

Figure 8D:
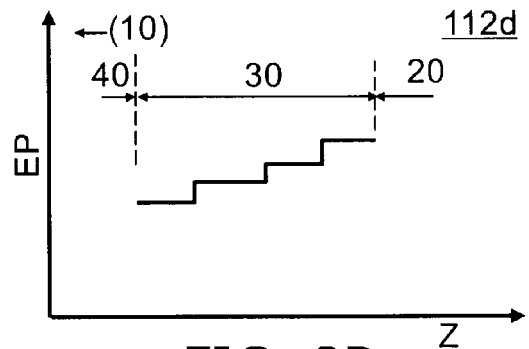

As illustrated in FIG. 8D, in a semiconductor light emitting device 112d according to the embodiment, the average In composition ratio EP in the multilayered structural body varies with three steps.

Figure 8E:
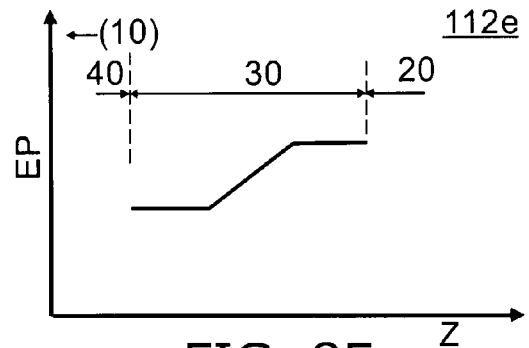

As illustrated in FIG. 8E, in a semiconductor light emitting device 112e according to the embodiment, the average In composition ratio EP has a low constant value region and a high constant value region, and a region between these two regions where the average In composition ratio EP varies continuously.

Thus, the average In composition ratio EP in the light emitting part 30 may vary continuously, or may vary in a stepwise manner in one or more steps.

In this way, the average In composition ratio EP in the light emitting part 30 increases in the direction from the first semiconductor layer 10 toward the second semiconductor layer 20. For example, the average In composition ratio EP gradually increases in the direction from the first semiconductor layer 10 toward the second semiconductor layer 20. Specifically, the average In composition ratio EP can increase in the direction from the first semiconductor layer 10 toward the second semiconductor layer 20 continuously or discontinuously (in stepwise). A number of steps in the variation of the average In composition ratio EP is as desired.

Thereby, the occurrence of dislocations and defects in the light emitting part 30 is further suppressed, and the luminous efficiency can be further improved.

The embodiment is not limited thereto. For example, while the average In composition ratio EP is increasing continuously or discontinuously (in stepwise) in the direction from the first semiconductor layer 10 toward the second semiconductor layer 20, there may be a narrow region where the average In composition ratio EP decreases.

Figure 8F:
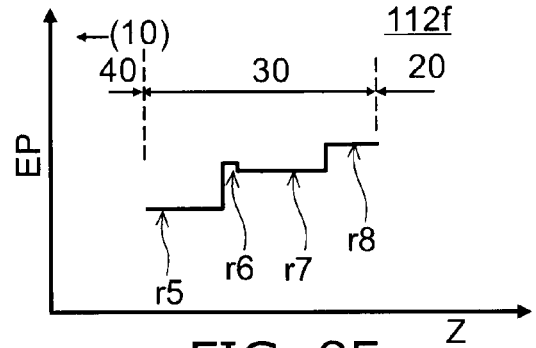

As illustrated in FIG. 8F, in a semiconductor light emitting device 112f according to the embodiment, while proceeding from the first semiconductor layer 10 to the second semiconductor layer 20, there is a region r5 where the average In composition ratio EP is low, then there is a region r6 where the average In composition ratio EP is higher than that of region r5, then there is a region r7 where the average In composition ratio EP is lower than that of region r6 and higher than that of region r5, and then there is a region r8 where the average In composition ratio EP is higher than that of region r6. The width of region r6 (the length along the Z-axis direction) is small compared with that of the region r5 or the region r7. In this case also, the occurrence of dislocations and defects in the light emitting part 30 is suppressed, and the luminous efficiency can be improved. In other words, in the light emitting layer 30, the approximate value of the average In composition ratio EP is set to be higher in the portion on the second semiconductor layer 20 side than in the portion on the first semiconductor layer 10 side.

Figure 8G:
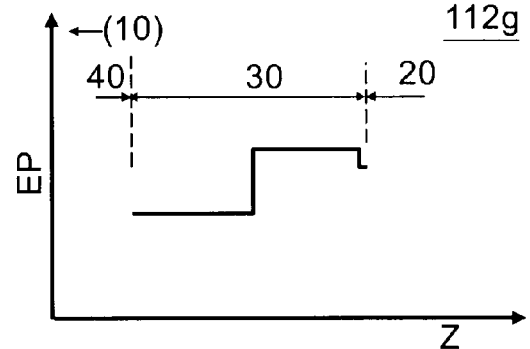

As illustrated in FIG. 8G, in a semiconductor light emitting device 112g according to the embodiment, while proceeding from the first semiconductor layer 10 to the second semiconductor layer 20, after the average In composition ratio EP has increased, the average In composition ratio EP decreases in a portion near the second semiconductor layer 20. In this case also, the approximate value of the average In composition ratio EP is higher in the portion on the second semiconductor layer 20 side than in the portion on the first semiconductor layer 10 side.

Figure 8H:
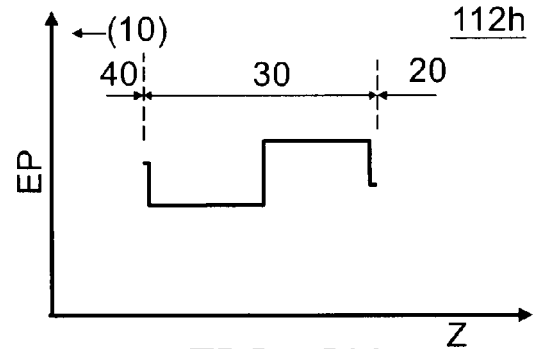

As illustrated in FIG. 8H, in a semiconductor light emitting device 112h according to the embodiment, the average In composition ratio EP in a portion near the multilayered structural body 40 is comparatively high, and while proceeding from the first semiconductor layer 10 to the second semiconductor layer 20, there is a broad region where the average In composition ratio EP is low. Then, while proceeding further from the first semiconductor layer 10 to the second semiconductor layer 20, the average In composition ratio EP increases, and then near the second semiconductor layer 20 the average In composition ratio EP decreases. In this case also, the approximate value of the average In composition ratio EP is higher in the portion on the second semiconductor layer 20 side than in the portion on the first semiconductor layer 10 side.

In the semiconductor light emitting device 112g and 112h also, the occurrence of dislocations and defects in the light emitting part 30 is suppressed, and the luminous efficiency can be improved.

The average In composition ratio EP in the portion that is substantially half of the light emitting part 30 on the second semiconductor layer 20 side is higher than the average In composition ratio EP in the portion that is substantially half of the light emitting part 30 on the first semiconductor layer 10 side.

Here, in the above, examples have been explained where a barrier layer 31 is disposed between the well layer 32 (the first well layer $WL_1$) closest to the first semiconductor layer 10 and the first semiconductor layer 10. However, a barrier layer 31 need not be provided between the first well layer $WL_1$ and the first semiconductor layer 10. Also, an example has been explained where a barrier layer 31 is disposed between the Mth well layer $WL_M$ closest to the second semiconductor layer 20 and the second semiconductor layer 20. However, a barrier layer 31 need not be provided between the Mth well layer $WL_M$ and the second semiconductor layer 20.

In this case also, the (j+1)th well layer 32 (the (j+1)th well layer $WL_{j+1}$) (where j is an integer greater than or equal to 1) is disposed closer to the second semiconductor layer 20 than the jth well layer 32 (the jth well layer $WL_j$). Also, the (j+1)th barrier layer 31 (the (j+1)th barrier layer $BL_{j+1}$) is disposed closer to the second semiconductor layer 20 than the jth barrier layer 31 (the jth barrier layer $BL_j$). For example, when a barrier layer 31 is not provided between the first well layer $WL_1$ and the first semiconductor layer 10, the first barrier layer $BL_1$ is provided between the first well layer $WL_1$ and the second well layer $WL_2$.

A jth barrier layer 31 (the jth barrier layer $BL_j$) is assumed to have an In composition ratio $yh_j$ among group III elements and a layer thickness $sh_j$ (nanometers).

A jth well layer 32 (jth well layer $WL_j$) is assumed to have an In composition ratio $yl_j$ and a layer thickness $sl_j$ (nanometers).

A number of the well layers 32 is M (where M is an integer greater than or equal to 2). The largest integer less than or equal to half of M is MLH.

A number of the well layers 31 located closer to the first semiconductor layer 10 than the MLHth well layer 32 (the MLHth well layer $WL_{MLH}$) is MHH. MHH is, for example, the same as MLH, or equal to (MLH−1).

A number of barrier layers 32 located closer to the second semiconductor layer 20 than a (MLH−1)th well layer 32 (a (MLH−1)th well layer $WL_{MLH-1}$) is assumed to be MHR. (MHH+MHR) is equal to (M−1) or M or (M+1).

An average In composition ratio EH1 is expressed:

$$EH1 = \frac{\sum_{j=1}^{MHH}(yh_j \cdot sh_j) + \sum_{j=1}^{MLH}(yl_j \cdot sl_j)}{\sum_{j=1}^{MHH} sh_j + \sum_{j=1}^{MLH} sl_j} \quad (3)$$

The average In composition ratio EH1 corresponds to the average In composition ratio EP in the portion that is substantially half of the light emitting part 30 on the first semiconductor layer 10 side.

An average In composition ratio EH2 is expressed:

$$EH2 = \frac{\sum_{j=MHH1}^{MHH+MHR}(yh_j \cdot sh_j) + \sum_{j=MLH+1}^{M}(yl_j \cdot sl_j)}{\sum_{j=MHH+1}^{MHH+MHR} sh_j + \sum_{j=MLH+1}^{M} sl_j} \quad (4)$$

The average In composition ratio EH2 corresponds to the average In composition ratio EP in the portion that is substantially half of the light emitting part 30 on the second semiconductor layer 20 side.

Here, in the embodiment, the average In composition ratio SH2 is set to be higher than the average In composition ratio SH1.

Thus, the occurrence of dislocations and defects in the light emitting part 30 is suppressed, and the luminous efficiency can be further improved by making the approximate value of the average In composition ratio EP in the light emitting part 30 in the portion on the second semiconductor layer 20 side higher than on the first semiconductor layer 10 side.

In the above, the average In composition ratio SP in the multilayered structural body 40 and the average In composition ratio EP in the light emitting part 30 was explained. In the following, the relationship between the average In composition ratio SP and the average In composition ratio EP is explained.

In the embodiment, the average In composition ratio EP in the light emitting part 30 is preferably set to be higher than or equal to the average In composition ratio SP in the multilayered structural body 40.

As explained already, in the multilayered structural body 40, the average In composition ratio $SA2=(xc \cdot tc+xd \cdot td)/(tc+td)$ of one pair located on the second semiconductor layer 20 side is set to be higher than the average In composition ratio $SA1=(xa \cdot ta+xb \cdot tb)/(ta+tb)$ of one pair located on the first semiconductor layer 10 side. In other words, 1<(SA2/SA1). Also, in the light emitting part, the average In composition ratio $EA2=(yc \cdot sc+yd \cdot sd)/(sc+sd)$ of one pair located on the second semiconductor layer 20 side is set to be higher than the average In composition ratio $EA1=(ya \cdot sa+yb \cdot sb)/(sa+sb)$ of one pair located on the first semiconductor layer 10 side.

Here, EA1 as defined above is preferably set to be higher than or equal to SA2 as defined above. In other words, the average In composition ratio increases preferably from the first semiconductor layer 10 to the second semiconductor layer 20. SA1<SA2≤EA1<EA2 is preferably satisfied. In other words, (SA2/SA1)≤(EA1/SA1) is satisfied. Also, (SA2/SA1)<(EA2/SA1) is satisfied.

Also, as has already been explained, for the multilayered structural body 40, 1<(SH2/SH1). Likewise, the average In composition ratio EH1 corresponding to the average In composition ratio of the portion that is substantially half of the light emitting part 30 on the first semiconductor layer 10 side is preferably set to be higher than or equal to the average In composition ratio SH2 corresponding to the average In composition ratio of the portion that is substantially half of the multilayered structural body 40 on the second semiconductor layer 20 side. In other words, SH1<SH2≤EH1<EH2 is preferably satisfied. (SH2/SH1)≤(EH1/SH1) is satisfied. Also, (SH2/SH1)<(EH2/SH1) is satisfied.

Thus, the occurrence of dislocations and defects in the light emitting part 30 is suppressed, and the luminous efficiency can be further improved by gradually increasing the average In composition ratio along the direction from the first semiconductor layer 10 toward the second semiconductor layer 20.

Here, if the variation in the average In composition ratio SP in the multilayered structural body 40 is excessively large, strain in the crystal of the multilayered structural body 40 becomes too large, and dislocations and defects are more likely to occur. Therefore, the degree of variation in the average In composition ratio SP is preferably set to be less than or equal to a fixed amount.

On the other hand, if the variation in the average In composition ratio EP in the light emitting part 30 is excessively large, strain in the crystal of the light emitting part 30 becomes too large, and dislocations and defects are more likely to occur. Therefore, the degree of variation in the average In composition ratio EP is preferably set to be less than or equal to a fixed amount. In other words, the ratio of the average In composition ratio EP on the second semiconductor layer 20 side of the light emitting part 30 to the average In composition ratio SP on the first semiconductor layer 10 side of the multilayered structural body 40 is preferably set to be less than or equal to a fixed amount.

Figure 9:
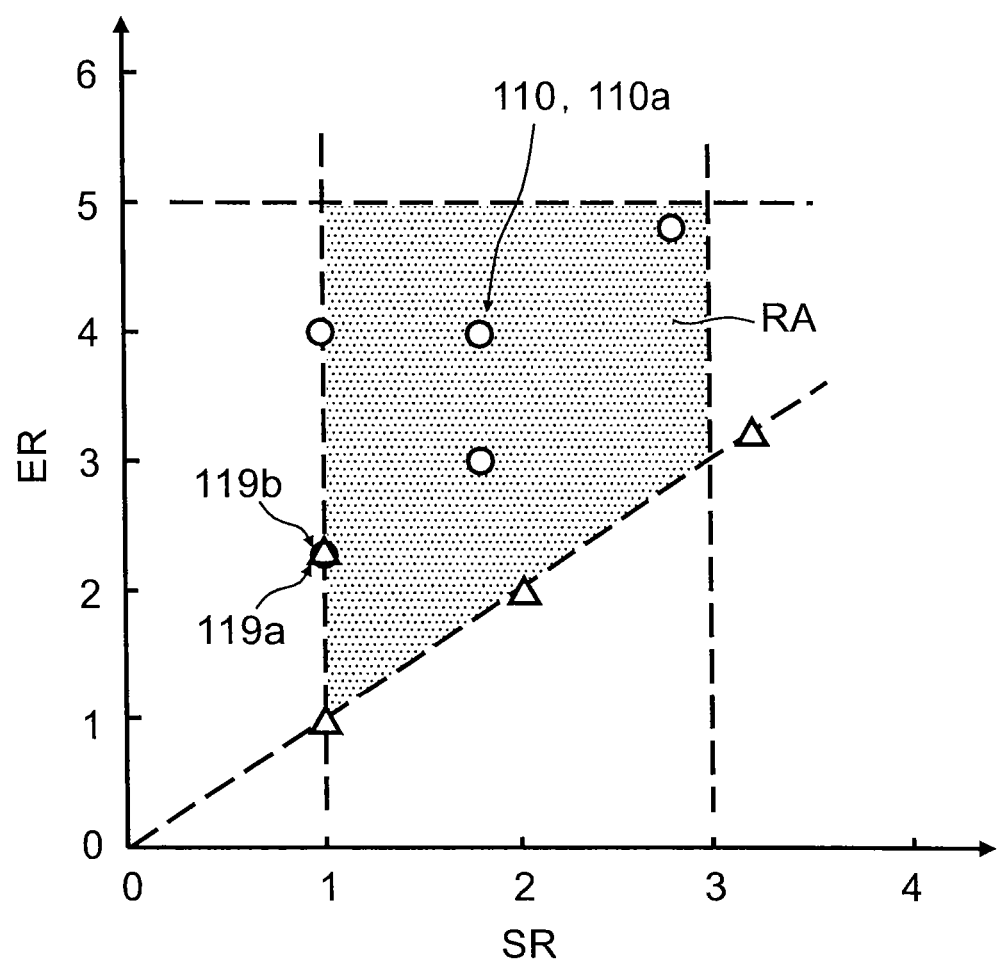
FIG. 9 is a schematic view illustrating the characteristics of semiconductor light emitting devices.

FIG. 9 is a schematic view illustrating the characteristics of semiconductor light emitting devices.

Specifically, this figure illustrates the luminous efficiency Eff of the semiconductor light emitting devices when various modifications are made to the multilayered structural body 40 and the light emitting part 30.

The horizontal axis of FIG. 9 is a ratio SR of the average In composition ratio SP on the first semiconductor layer 20 side of the multilayered structural body 40 to the average In composition ratio SP on the second semiconductor layer 10 side of the multilayered structural body 40. The ratio SR is (SA2/SA1), for example. The ratio SR can be (SH2/SH1), for example. Also, the ratio SR can be the ratio of the average In composition ratio SP of the pair of the high energy layer 41 closest to the second semiconductor layer 20 and the low energy layer 42 adjacent thereto in the multilayered structural body 40, and the average In composition ratio SP of the pair of the high energy layer 41 closest to the first semiconductor layer 10 and the low energy layer 42 adjacent thereto in the multilayered structural body 40.

The vertical axis of FIG. 9 is a ratio ER of the average In composition ratio EP on the first semiconductor layer 20 side of the light emitting part 30 to the average In composition ratio SP on the second semiconductor layer 10 side of the multilayered structural body 40. The ratio ER is (EA2/SA1), for example. The ratio ER can be (EH2/SH1), for example. Also, the ratio ER can be the ratio of the average In composition ratio EP of the pair of the barrier layer 31 closest to the second semiconductor layer 20 and the well layer 32 adjacent thereto in the light emitting part 30, to the average In composition ratio SP of the pair of the high energy layer 41 closest to the first semiconductor layer 10 and the low energy layer 42 adjacent thereto in the multilayered structural body 40.

In FIG. 9, the circle symbol indicates that the luminous efficiency Eff is higher than or equal to 0.65, and the triangle symbol indicates that the luminous efficiency Eff is less than 0.65.

In the semiconductor light emitting device 110 according to the embodiments as explained above, the ratio SR is 1.8 and the ratio ER is 4. In the semiconductor light emitting device 119a of the first reference example, the ratio SR is 1, and the ratio ER is 2. In the semiconductor light emitting device 119b of the second reference example, the ratio SR is 1, and the ratio ER is 2.2.

As illustrated in FIG. 9, when the ratio ER is less than or equal to SR, the luminous efficiency Eff is smaller than 0.65. In other words, when the average In composition ratio EP in the portion on the second semiconductor layer 20 side of the light emitting part 30 (for example at least one of EA2 and EH2) is less than or equal to the average In composition ratio SP in the portion on the first semiconductor layer 10 side of the multilayered structural body 40 (for example at least one of SA1 and SH1), the luminous efficiency Eff is low. Under this condition, it is considered that appropriate strain is not applied to the crystal of the light emitting part 30, thus the luminous efficiency decreases.

In the semiconductor light emitting device according to the embodiment, the average In composition ratio of the multilayered structural body 40 and the light emitting part 30 is set to the condition of the hatched region RA as indicated in FIG. 9.

In other words, SR<ER is set. For example, SA1<EA2. For example, SH1<EH2. Thereby, the average In composition ratio EP in the portion of the light emitting part 30 on the second semiconductor layer 20 side is higher than the average In composition ratio SP in the portion of the multilayered structural body 40 on the first semiconductor layer 10 side, thus, appropriate strain is applied to the light emitting part 30, and the luminous efficiency is improved.

Also, 1<SR is set. For example, SA1<SA2. For example, SH1<SH2. Thereby, the occurrence of dislocations and defects in the light emitting part 30 is suppressed and the luminous efficiency can be improved by making the average In composition ratio of the multilayered structural body 40 in the portion on the second semiconductor layer 20 side higher than in the portion on the first semiconductor layer 10 side.

Also, SR≤3 is set. For example, (SA2/SA1)≤3. For example, (SH2/SH1)≤3. Thereby, excessive compressive strain in the multilayered structural body 40 is suppressed, and the luminous efficiency is improved.

In addition, ER≤5 is set. For example, (EA2/SA1)≤5. For example, (EH2/SH1)≤5. In this way, excessive compressive strain in the light emitting part 30 is suppressed, and the luminous efficiency is improved.

In this way, SA2 as described above is preferably set to be less than or equal to three times SA1 as described above. SH2 as described above is preferably set to be less than or equal to three times SH1 as described above. For example, the average In composition ratio SP of the pair of the high energy layer 41 closest to the second semiconductor layer 20 and the low energy layer 42 adjacent thereto in the multilayered structural body 40 is preferably less than or equal to three times the average In composition ratio SP of the pair of the high energy layer 41 closest to the first semiconductor layer 10 and the low energy layer 42 adjacent thereto in the multilayered structural body 40.

Also, EA2 as described above is preferably set to be less than or equal to five times SA1 as described above. EH2 as described above is preferably set to be less than or equal to five times SH1 as described above. For example, the average In composition ratio EP of the pair of the barrier layer 31 closest to the second semiconductor layer 20 and the well layer 32 adjacent thereto in the light emitting part 30 is preferably less than or equal to five times the average In composition ratio SP of the pair of the high energy layer 41 closest to the first semiconductor layer 10 and the low energy layer 42 adjacent thereto in the multilayered structural body 40.

It is possible to suppress the occurrence of dislocations and defects in the crystals of the light emitting part 30 and improve the luminous efficiency by setting 1<SR and SR<ER, in other words, by increasing the average In composition ratio of the multilayered structural body 40 and the light emitting part 30 in the direction from the first semiconductor layer 10 toward the second semiconductor layer 20.

Also, by setting 1<SR≤3, and SR<ER≤5, it is possible to further increase the luminous efficiency by applying the appropriate strain to the well layers 32 of the light emitting part 30 while suppressing an excessive strain from being applied to the multilayered structural body 40 and the light emitting part 30.

In the embodiment, for making the average In composition ratio SA2 on the second semiconductor layer 20 side higher than the average In composition ratio SA1 on the first semiconductor layer 10 side, for example, a configuration can be used in which the thickness of the high energy layers 41 and the thickness of the low energy layers 42 are made constant and at least one of the In composition ratio of the high energy layers 41 and the In composition ratio of the low energy layers 42 is varied.

For making SA2 higher than SA1, for example, a configuration can be used in which the In composition ratio of the high energy layers 41 and the In composition ratio of the low energy layers 42 are made constant and at least one of the thicknesses of the high energy layers 41 and the thickness of the low energy layers 42 is varied.

For example, a GaN layer with a thickness of 3.0 nm can be used for the high energy layer 41 and an $In_{0.05}Ga_{0.95}N$ layer with a thickness of 1.0 nm can be used for the low energy layers 42 on the first semiconductor layer 10 side of the multilayered structural body 40. And a GaN layer with a thickness of 3.0 nm can be used for the high energy layer 41 and an $In_{0.05}Ga_{0.95}N$ layer with a thickness of 1.2 nm can be used for the low energy layers 42 on the second semiconductor layer 20 side of the multilayered structural body 40.

In this case, in the multilayered structural body 40, the In composition ratio of the high energy layers 41 is constant, the In composition ratio of the low energy layers 42 is constant, the thicknesses of the high energy layers 41 is constant and the thickness of the low energy layers 42 is varied. In other words, the thickness td is different from the thickness tb.

In this condition, the potential barrier for the electron injection can be decreased. Thereby, the operating voltage can be decreased.

If an InGaN with a high In composition ratio is used, a surface fluctuation easily occurs and the operating voltage may be increased. However, in the configuration recited above, the increase of the operating voltage can be suppressed because the In composition ratio is not excessively high.

Thus, in the configuration in which the thickness is varied, there is an advantage that the operating voltage can be decreased in addition to the improvement of the efficiency.

Furthermore, for making SA2 higher than SA1, for example, a configuration can be used in which the In composition ratio and the thickness of the high energy layers 41 and the In composition ratio and the thickness of the low energy layers 42 are varied. In this configuration, the operating voltage can be also decreased because the thickness is varied.

Therefore, it is preferable that the multilayered structural body 40 has at least one of the layer thickness tc different from the layer thickness ta, and the layer thickness td different from the layer thickness tb.

On the other hand, for making EA2 higher than EA1, for example, a configuration can be used in which the thickness of the barrier layers 31 and the thickness of the well layers 32 are made constant and at least one of the In composition ratio of the barrier layers 31 and the In composition ratio of the well layers 42 is varied. By making EA2 higher than EA1, the efficiency can be improved.

For making EA2 higher than EA1, for example, a configuration can be used in which the In composition ratio of the barrier layers 31 and the In composition ratio of the well layers 32 are made constant and at least one of the thicknesses of the barrier layers 31 and the thickness of the well layers 32 is varied. In the configuration in which the thickness is varied as described above, the operating voltage can be decreased in addition to the improvement of the efficiency.

Furthermore, for making EA2 higher than EA1, for example, a configuration can be used in which the In composition ratio and the thickness of the barrier layers 31 and the In composition ratio and the thickness of the well layers 32 are varied. In this configuration, the operating voltage can be also decreased in addition to the improvement of the efficiency.

According to the embodiment, a highly efficient semiconductor light emitting device can be provided.

Note that in the specification, the term, "nitride semiconductor" includes semiconductors of all compositions wherein composition ratios of x, y, and z in the formula $B_xIn_yAl_zGa_{1-x-y-z}N$ ($0 \leq x \leq 1$, $0 \leq 1$, $0 \leq y \leq 1$, $0 \leq z \leq 1$, and $x+y+z \leq 1$) fall within the respective ranges. Furthermore, in the formula described above, "nitride semiconductors" shall also be understood to include semiconductors further including group V elements other than N (nitrogen), semiconductors further including various elements added to control various physical properties such as conductivity type and the like, and semiconductors further including various elements that are included unintentionally.

In the specification, "perpendicular" and "parallel" are not used to mean perpendicular and parallel in their narrowest sense, but rather substantially perpendicular or parallel so as to take factors into account such as variations in manufacturing processes and the like.

An embodiment of the invention with reference to specific examples was described above. However, the invention is not limited to these examples. For example, the scope of the invention includes all cases in which, for example, a person skilled in the art could make use of publicly known information to appropriately select constituents such as the substrate, buffer layer, semiconductor layer, light emitting layer, barrier layers, well layers, multilayered structural body, high energy layers, low energy layers, stacked structural body, electrodes, and the like included in the semiconductor light emitting device provided that the obtained effects are similar. For example, the compositions, film thicknesses, and the like described in the embodiments described above are examples and various selections are possible.

Additionally, combinations of constituents from two or more of the examples are also included in the scope of the invention, provided they are technically possible and do not depart from the spirit of the invention.

Beside such cases, all semiconductor light emitting devices based on the embodiments of the invention described above that are obtainable through appropriate design modifications by a person skilled in the art shall be understood to fall within the scope of the invention, provided such semiconductor light emitting devices do not depart from the spirit of the invention.

Furthermore, regarding the scope of the spirit of the invention, it is understood that a variety of variations and modifications could be conceived by a person skilled in the art and that these variations and modifications all fall within the scope of the invention as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   a first semiconductor layer of n-type conductivity including a nitride semiconductor;
   a second semiconductor layer of p-type conductivity including a nitride semiconductor;
   a light emitting part provided between the first semiconductor layer and the second semiconductor layer, the light emitting part including a plurality of barrier layers and a plurality of well layers alternately stacked with the barrier layers, the barrier layers including a nitride semiconductor, the well layers including a nitride semiconductor and having a band gap energy lower than a band gap energy of the barrier layers; and
   a multilayered structural body provided between the first semiconductor layer and the light emitting part, the multilayered structural body including a plurality of high energy layers and a plurality of low energy layers alternately stacked with the high energy layers, the high energy layers including a nitride semiconductor, the low energy layers including a nitride semiconductor and having a band gap energy lower than a band gap energy of the high energy layers,
   one of the high energy layers having an In composition ratio xa among group III elements and a layer thickness to (nanometers),
   one of the low energy layers in contact with the one of the high energy layers having an In composition ratio xb among group III elements and a layer thickness tb (nanometers),
   other one of the high energy layers located closer to the second semiconductor layer than the one of the high energy layers having an In composition ratio xc among group III elements and a layer thickness tc (nanometers),
   other one of the low energy layers in contact with the other one of the high energy layers having an In composition ratio xd among group III elements and a layer thickness td (nanometers),
   $SA2=(xc \cdot tc+xd \cdot td)/(tc+td)$ being higher than $SA1=(xa \cdot ta+xb \cdot tb)/(ta+tb)$,
   one of the barrier layers having an In composition ratio ya among group III elements and a layer thickness sa (nanometers),
   one of the well layers in contact with the one of the barrier layers having an In composition ratio yb among group III elements and a layer thickness sb (nanometers),
   other one of the barrier layers located closer to the second semiconductor layer than the one of the barrier layers having an In composition ratio yc among group III elements and a layer thickness sc (nanometers),
   other one of the well layers in contact with the other one of the barrier layers having an In composition ratio yd among group III elements and a layer thickness sd (nanometers),
   $EA2=(yc \cdot sc+yd \cdot sd)/(sc+sd)$ being higher than $EA1=(ya \cdot sa+yb \cdot sb)/(sa+sb)$,
   EA1 being higher than or equal to SA2,
   the SA2 being less than or equal to three times the SA1, and
   the EA2 is less than or equal to five times the SA1.

2. The device according to claim 1, wherein
   one of the high energy layers has an In composition ratio xu among group III elements and a layer thickness to (nanometers),
   one of the low energy layers in contact with the one of the high energy layers which has the In composition ratio xu has an In composition ratio xv among group III elements and a layer thickness tv (nanometers), and an average In composition ratio SP=(xu·tu+xv·tv)/(tu+tv) increases in a direction from the first semiconductor layer toward the second semiconductor layer.

3. The device according to claim 1, wherein
one of the barrier layers has an In composition ratio yu among group III elements and a layer thickness su (nanometers),
one of the well layers in contact with the one of the barrier layers which has the In composition ratio yu has an In composition ratio yv among group III elements and a layer thickness sv (nanometers), and
the average In composition ratio EP=(yu·su+yv·sv)/(su+sv) increases in a direction from the first semiconductor layer toward the second semiconductor layer.

4. The device according to claim 1, wherein
SR is equal to SA2/SA1,
ER is equal to EA2/SA1,
a first point indicates that the SR is 1.8 and the ER is 3.0, a second point indicates that the SR is 1.8 and the ER is 4.0, and a third point indicates that the SR is 2.8 and the ER is 4.9 in a coordinate system indicating that the SR is a horizontal axis and the ER is a vertical axis, and
the SR and the ER are values within a range formed by connecting the first to third points.

5. The device according to claim 1, wherein
an (i+1)th layer of the high energy layers (where i is an integer greater than or equal to 1) is disposed closer to the second semiconductor layer than an ith layer of the high energy layers,
an (i+1)th layer of the low energy layers is disposed closer to the second semiconductor layer than an ith layer of the low energy layers,
the ith layer of the high energy layers has an In composition ratio $xh_i$ among group III elements, and a layer thickness $th_i$ (nanometers),
the ith layer of the low energy layers has an In composition ratio $xl_i$ among group III elements, and a layer thickness $tl_i$ (nanometers),
a number of the low energy layers is N (where N is an integer greater than or equal to 2),
a largest integer less than or equal to half of the N is NLH,
a number of the high energy layers located closer to the first semiconductor layer than an NLHth layer of the low energy layers is NHH,
a number of the high energy layers located closer to the second semiconductor layer than an (NLH−1)th layer of the low energy layers is NHR,
and when an average In composition ratio SH1 is expressed:

$$SH1 = \frac{\sum_{i=1}^{NHH}(xh_i \cdot th_i) + \sum_{i=1}^{NLH}(xl_i \cdot tl_i)}{\sum_{i=1}^{NHH} th_i + \sum_{i=1}^{NLH} tl_i} \quad (1)$$

and an average In composition ratio SH2 is expressed:

$$SH2 = \frac{\sum_{i=NHH+1}^{NHH+NHR}(xh_i \cdot th_i) + \sum_{i=NLH+1}^{N}(xl_i \cdot tl_i)}{\sum_{i=NHH+1}^{NHH+NHR} th_i + \sum_{i=NLH+1}^{N} tl_i} \quad (2)$$

the average In composition ratio SH2 is higher than the average In composition ratio SH1.

6. The device according to claim 5, wherein the average In composition ratio SH2 is less than or equal to three times the average In composition ratio SH1.

7. The device according to claim 5, wherein
a (j+1)th layer of the barrier layers (where j is an integer greater than or equal to 1) is disposed closer to the second semiconductor layer than a jth layer of the barrier layers,
a (j+1)th layer of the well layers is disposed closer to the second semiconductor layer than a jth layer of the well layers,
the jth layer of the barrier layers has an In composition ratio $xh_i$ among group III elements, and a layer thickness $th_i$ (nanometers),
the jth layer of the well layers has an In composition ratio $xl_i$ among group III elements, and a layer thickness $tl_i$ (nanometers),
a number of the well layers is M (where M is an integer greater than or equal to 2),
a largest integer less than or equal to half of the M is MLH,
a number of well layers located closer to the first semiconductor layer than an MLHth layer of the well layers is MHH,
a number of the barrier layers located closer to the second semiconductor layer than an (MLH−1)th layer of the well layers is MHR,
an average In composition ratio EH1 is expressed:

$$EH1 = \frac{\sum_{j=1}^{MHH}(yh_j \cdot sh_j) + \sum_{j=1}^{MLH}(yl_j \cdot sl_j)}{\sum_{j=1}^{MHH} sh_j + \sum_{j=1}^{MLH} sl_j} \quad (3)$$

and when an average In composition ratio EH2 is expressed:

$$EH2 = \frac{\sum_{j=MHH+1}^{MHH+MHR}(yh_j \cdot sh_j) + \sum_{j=MLH+1}^{M}(yl_j \cdot sl_j)}{\sum_{j=MHH+1}^{MHH+MHR} sh_j + \sum_{j=MLH+1}^{M} sl_j} \quad (4)$$

the average In composition ratio EH2 is higher than or equal to the average In composition ratio EH1, and the average In composition ratio EH1 is higher than or equal to the average In composition ratio SH2.

8. The device according to claim 7, wherein the average In composition ratio EH2 is less than or equal to five times the average In composition ratio SH1.

9. The device according to claim 1, wherein the multilayered structural body having at least one of the layer thickness tc different from the layer thickness ta, and the layer thickness td different from the layer thickness tb.

10. The device according to claim 9, wherein the xa equals to the xc.

11. The device according to claim 10, wherein the xb equals to the xd.

12. A semiconductor light emitting device comprising:
a first semiconductor layer of an n-type conductivity including a nitride semiconductor;
a second semiconductor layer a p-type conductivity including a nitride semiconductor; a light emitting part provided between the first semiconductor layer and the second semiconductor layer, the light emitting part including a plurality of barrier layers and a plurality of well layers alternately stacked with the barrier layers, the barrier layers including a nitride semiconductor, the well layers including a nitride semiconductor and having a band gap energy lower than a band gap energy of the barrier layers; and a multilayered structural body provided between the first semiconductor layer and the light emitting part, the multilayered structural body including a plurality of high energy layers and a plurality of low energy layers alternately stacked with the high energy layers, the high energy layers including a nitride semiconductor, the low energy layers including a nitride semiconductor and having a band gap energy lower than a band gap energy of the high energy layers, one of the high energy layers having an In composition ratio xa among group III elements and a layer thickness ta (nanometers), one of the low energy layers in contact with the one of the high energy layers having an In composition ratio xb among group III elements and a layer thickness tb (nanometers), other one of the high energy layers located closer to the second semiconductor layer than the one of the high energy layers having an In composition ratio xc among group III elements and a layer thickness tc (nanometers), other one of the low energy layers in contact with the other one of the high energy layers having an In composition ratio xd among group III elements and a layer thickness td (nanometers), SA2=(xc·tc+xd·td)/(tc+td) being higher than SA1=(xa·ta+xb·tb)/(ta+tb), and the multilayered structural body having at least one of the layer thickness tc different from the layer thickness ta, and the layer thickness td different from the layer thickness tb, one of the barrier layers having an In composition ratio ya among group III elements and a layer thickness sa (nanometers), one of the well layers in contact with the one of the barrier layers having an In composition ratio yb among group III elements and a layer thickness sb (nanometers), other one of the barrier layers located closer to the second semiconductor layer than the one of the barrier layers having an In composition ratio yc among group III elements and a layer thickness sc (nanometers), other one of the well layers in contact with the other one of the barrier layers having an In composition ratio yd among group III elements and a layer thickness sd (nanometers), EA2=(yc·sc+yd·sd)/(sc+sd) being higher than EA1=(ya·sa+yb·sb)/(sa+sb), EA1 being higher than or equal to SA2, the SA2 being less than or equal to three times the SA1, and the EA2 is less than or equal to five times the SA1.

13. The device according to claim 12, wherein
one of the high energy layers has an In composition ratio xu among group III elements and a layer thickness tu (nanometers),
one of the low energy layers in contact with the one of the high energy layers which has the In composition ratio xu has an In composition ratio xv among group III elements and a layer thickness tv (nanometers), and
an average In composition ratio SP=(xu·tu+xv·tv)/(tu+tv) increases in a direction from the first semiconductor layer toward the second semiconductor layer.

14. The device according to claim 12, wherein the xa equals to the xc.

15. The device according to claim 14, wherein the xb equals to the xd.

16. The device according to claim 12, wherein
an (i+1)th layer of the high energy layers (where i is an integer greater than or equal to 1) is disposed closer to the second semiconductor layer than an ith layer of the high energy layers,
an (i+1)th layer of the low energy layers is disposed closer to the second semiconductor layer than an ith layer of the low energy layers,
the ith layer of the high energy layers has an In composition ratio $xh_i$ among group III elements, and a layer thickness $th_i$ (nanometers),
the ith layer of the low energy layers has an In composition ratio $xl_i$ among group III elements, and a layer thickness $tl_i$ (nanometers),
a number of the low energy layers is N (where N is an integer greater than or equal to 2),
a largest integer less than or equal to half of the N is NLH,
a number of the high energy layers located closer to the first semiconductor layer than the NLHth layer of the low energy layers is NHH,
a number of the high energy layers located closer to the second semiconductor layer than the (NLH−1)th layer of the low energy layer is NHR,
and when an average In composition ratio SH1 is expressed:

$$SH1 = \frac{\sum_{i=1}^{NHH}(xh_i \cdot th_i) + \sum_{i=1}^{NLH}(xl_i \cdot tl_i)}{\sum_{i=1}^{NHH} th_i + \sum_{i=1}^{NLH} tl_i} \quad (1)$$

and an average In composition ratio SH2 is expressed:

$$SH2 = \frac{\sum_{i=NHH+1}^{NHH+NHR}(xh_i \cdot th_i) + \sum_{i=NLH+1}^{N}(xl_i \cdot tl_i)}{\sum_{i=NHH+1}^{NHH+NHR} th_i + \sum_{i=NLH+1}^{N} tl_i} \quad (2)$$

the average In composition ratio SH2 is higher than the average In composition ratio SH1.

17. The device according to claim 16, wherein the average In composition ratio SH2 is less than or equal to three times the average In composition ratio SH1.

* * * * *